United States Patent
Han et al.

(10) Patent No.: US 11,532,517 B2
(45) Date of Patent: Dec. 20, 2022

(54) LOCALIZED ETCH STOP LAYER

(71) Applicant: Tokyo Electron Limited, Tokyo (JP)

(72) Inventors: Yun Han, Albany, NY (US); Andrew Metz, Albany, NY (US); Xinghua Sun, Albany, NY (US); David L. O'Meara, Albany, NY (US); Kandabara Tapily, Albany, NY (US); Henan Zhang, Albany, NY (US); Shan Hu, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 21 days.

(21) Appl. No.: 16/781,078

(22) Filed: Feb. 4, 2020

(65) Prior Publication Data

US 2021/0242089 A1    Aug. 5, 2021

(51) Int. Cl.
*H01L 21/8234* (2006.01)
*H01L 21/20* (2006.01)
*H01L 21/311* (2006.01)
*H01L 27/088* (2006.01)
*H01L 29/78* (2006.01)
(Continued)

(52) U.S. Cl.
CPC .. *H01L 21/823475* (2013.01); *H01L 21/0228* (2013.01); *H01L 21/02118* (2013.01); *H01L 21/31133* (2013.01); *H01L 21/823418* (2013.01); *H01L 21/823431* (2013.01); *H01L 27/0886* (2013.01); *H01L 29/66545* (2013.01)

(58) Field of Classification Search
CPC ..... H01L 21/823418; H01L 21/823431; H01L 21/823475; H01L 27/0886; H01L 29/66545; H01L 29/785; H01L 21/0228; H01L 21/31133; H01L 21/02118; H01L 29/7848; H01L 29/165; H01L 29/41791; H01L 29/66795; H01L 21/823437; H01L 21/76897; H01L 2221/1063
See application file for complete search history.

(56) References Cited

U.S. PATENT DOCUMENTS

| 5,298,463 | A | 3/1994 | Sandhu et al. |
| 7,078,282 | B2 | 7/2006 | Chau et al. |
| 8,120,114 | B2 | 2/2012 | Ott et al. |

(Continued)

FOREIGN PATENT DOCUMENTS

WO    2010002694    1/2010

OTHER PUBLICATIONS

Wolf et al., Silicon Processing for the VLSI Era, vol. 1—Process Technology, Lattice Press, Sunset Beach, CA, 1986, pp. 539-542 (Year: 1986).*

*Primary Examiner* — Mary A Wilczewski
(74) *Attorney, Agent, or Firm* — Oblon, McClelland, Maier & Neustadt, L.L.P.

(57) ABSTRACT

In one embodiment, a method includes providing a substrate comprising a source/drain contact region and a dummy gate, forming a first etch stop layer aligned to the source/drain contact region, where the first etch stop layer does not cover the dummy gate. The method may include forming a second etch stop layer over the first etch stop layer, the second etch stop layer covering the first etch stop layer and the dummy gate. The method may include converting the dummy gate to a metal gate. The method may include removing the second etch stop layer using a plasma etching process. The method may include removing the first etch stop layer.

16 Claims, 19 Drawing Sheets

(51) Int. Cl.
*H01L 29/66* (2006.01)
*H01L 21/02* (2006.01)

(56) References Cited

U.S. PATENT DOCUMENTS

| | | | | |
|---|---|---|---|---|
| 9,633,835 | B2* | 4/2017 | Glass | H01L 21/76897 |
| 9,895,715 | B2 | 2/2018 | Haukka et al. | |
| 9,985,023 | B1* | 5/2018 | Liu | H01L 29/41791 |
| 10,269,649 | B2* | 4/2019 | Wang | H01L 29/66795 |
| 10,629,739 | B2* | 4/2020 | Zang | H01L 21/823468 |
| 10,784,258 | B2* | 9/2020 | Mehta | H01L 21/02167 |
| 10,840,139 | B2* | 11/2020 | Seong | H01L 21/76829 |
| 2013/0065371 | A1* | 3/2013 | Wei | H01L 21/823418 |
| | | | | 438/294 |
| 2015/0069473 | A1* | 3/2015 | Glass | H01L 29/66795 |
| | | | | 257/288 |
| 2015/0303118 | A1* | 10/2015 | Wang | H01L 29/41791 |
| | | | | 257/401 |
| 2016/0111537 | A1* | 4/2016 | Tsai | H01L 21/0262 |
| | | | | 257/192 |
| 2016/0181399 | A1* | 6/2016 | Jun | H01L 29/165 |
| | | | | 438/294 |
| 2016/0351570 | A1* | 12/2016 | Park | H01L 21/823814 |
| 2017/0040164 | A1 | 2/2017 | Wang et al. | |
| 2017/0047253 | A1* | 2/2017 | Park | H01L 21/823821 |
| 2017/0229342 | A1* | 8/2017 | Glass | H01L 21/76879 |
| 2018/0219077 | A1* | 8/2018 | Wang | H01L 29/66818 |
| 2019/0103277 | A1* | 4/2019 | Luan | H01L 29/401 |
| 2019/0333812 | A1* | 10/2019 | Seong | H01L 29/7851 |
| 2019/0333916 | A1* | 10/2019 | Mehta | H01L 29/045 |
| 2019/0393095 | A1* | 12/2019 | Lin | H01L 21/823418 |
| 2020/0027979 | A1* | 1/2020 | Zang | H01L 21/823468 |
| 2020/0098890 | A1* | 3/2020 | Wu | H01L 29/6656 |
| 2021/0202255 | A1* | 7/2021 | Luan | H01L 21/30604 |
| 2021/0242089 | A1* | 8/2021 | Han | H01L 27/0886 |

\* cited by examiner

LOCALIZED ETCH STOP LAYER

TECHNICAL FIELD

The present invention relates generally to semiconductor device fabrication, and more particularly, to methods for forming a localized etch stop layer for source/drain epitaxial control.

BACKGROUND

Advancement in semiconductor technologies relies on continued improvement in manufacturing fabrication technology. Innovation in semiconductor technologies has resulted in the introduction of new types of structures such as FinFET devices, stacked structures (e.g., 3D NAND devices). However, these new structures introduce a need for new fabrication schemes to overcome, what would otherwise be, debilitating manufacturing challenges. One such challenge arises from damage to the contact layers as a result of semiconductor plasma processing techniques. For instance, a dry etch process such as reactive Ion etching (RIE) may be used to open contacts within traditional middle-of-line (MOL) process flow. Often, the dry etch process can be quite aggressive for some layers within a semiconductor process flow. Typically, the dry etch process possesses a plasma source that generates a sea of ions that accelerate in a manner that causes ion bombardment against sensitive device layers. Resultantly, the plasma etch processes may cause damage to the underlying material, especially when opening high aspect ratio contact holes. This damage to the underlying material can then lead to uncontrolled variations in device electrical performance, as well as yield loss.

SUMMARY

In accordance with an embodiment of the present invention, a method includes forming a metal based etch stop layer covering a surface of a semiconductor substrate; forming a nitride etch stop layer over the metal based etch stop layer; etching the nitride etch stop layer with a plasma etch process to expose a surface of the metal based etch stop layer; and removing the metal based etch stop layer using an etching process that selectively removes the metal based etch stop layer.

In accordance with an alternative embodiment of the present invention, a method includes providing a substrate comprising a source/drain contact region and a dummy gate, forming a first etch stop layer aligned to the source/drain contact region, where the first etch stop layer does not cover the dummy gate. The method may include forming a second etch stop layer over the first etch stop layer, the second etch stop layer covering the first etch stop layer and the dummy gate. The method may include converting the dummy gate to a metal gate. The method may include removing the second etch stop layer using a plasma etching process. The method may include removing the first etch stop layer.

In accordance with an alternative embodiment of the present invention, a method includes providing a plurality of fins over a substrate and a plurality of dummy gates over the plurality of fins, and forming epitaxial regions over each of the plurality of fins, where the epitaxial regions extending between adjacent ones of the plurality of dummy gates. The method includes forming localized etch stop regions covering the epitaxial regions, the localized etch stop regions being formed locally only over the epitaxial regions without covering the plurality of dummy gates. The method may include depositing a global etch stop layer over the substrate, the global etch stop layer covering the plurality of dummy gates and the localized etch stop regions. The method may include depositing an insulating material over the global etch stop layer. The method may include converting the plurality of dummy gates to a plurality of metal gates. The method may include using a contact opening mask, removing an underlying portion of the insulating material to expose an underlying portion of the global etch stop layer. The method may include removing the underlying portion of the global etch stop layer by a plasma etch process. The method may include removing the localized etch stop regions.

In accordance with an alternative embodiment of the present invention, a semiconductor device includes a fin disposed over a semiconductor substrate; an isolation region disposed proximate to the fin; a metal gate disposed over the fin; a raised source/drain region disposed over the fin, the top surface including a contact area and remaining area. The device may include a metal based etch stop layer disposed over the raised source/drain region, the metal based etch stop layer covering substantially all of the remaining area of the top surface of the raised source/drain region. The device may include a nitride etch stop layer disposed over the metal based etch stop layer and the isolation region. The nitride etch stop layer may contact the isolation region and be separated from the remaining area of the top surface by the metal based etch stop layer.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1B illustrate a generic embodiment of a method of protecting a substrate from damage during plasma etching to form contacts in accordance with an embodiment of the present invention, wherein FIG. 1A illustrates a cross sectional representation of the semiconductor device during fabrication in accordance, and wherein FIG. 1B illustrates a cross sectional view of the semiconductor device during a subsequent stage of fabrication;

FIG. 3A illustrates a partial cross sectional view of a semiconductor device during fabrication along a direction of a fin, wherein FIG. 3B shows a cross sectional view of the semiconductor device along a direction orthogonal to the direction of the fin, and wherein

Figure 1A:
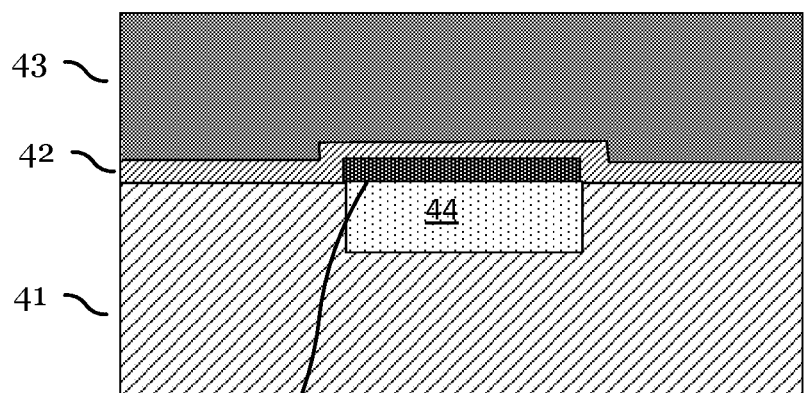

The drawings are not necessarily drawn to scale. The drawings are merely representations, not intended to portray specific parameters of the invention. The drawings are intended to depict only specific embodiments of the inventions, and therefore should not be considered as limiting in scope. In the drawings, like numbering represents like elements.

DETAILED DESCRIPTION OF ILLUSTRATIVE EMBODIMENTS

The method and using of various embodiments of a semiconductor device are discussed in detail below. However, it should be valued that the various embodiments detailed herein may be applicable in a wide variety of disciplines. The specific embodiments described herein are merely illustrative of specific ways to make and use various embodiments, and should not be construed in a limited scope.

Embodiments of the present application disclose a method for preventing damage to semiconductor regions during plasma etching. The proposed integration scheme uses a localized metal oxide or metal nitride layer formed directly on top of a semiconductor region to be protected. This localized layer is designed to protect the semiconductor region during the plasma etching process that would otherwise damage the semiconductor region. This localized layer may be formed to be a sacrificial layer that is removed later in the process using a gentle wet clean process.

Figure 1B:
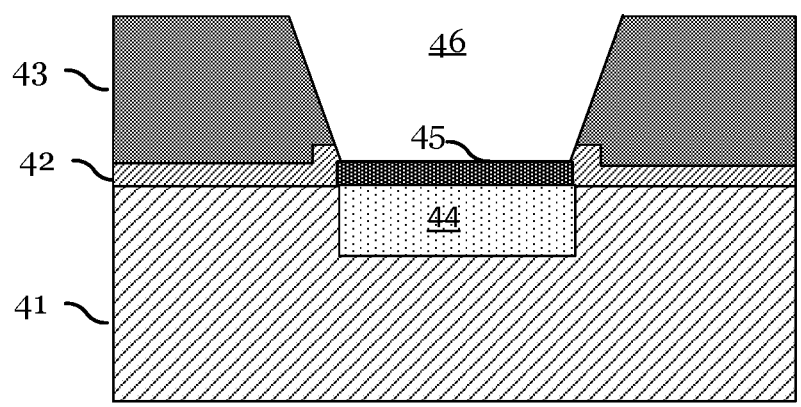
Figure 2:
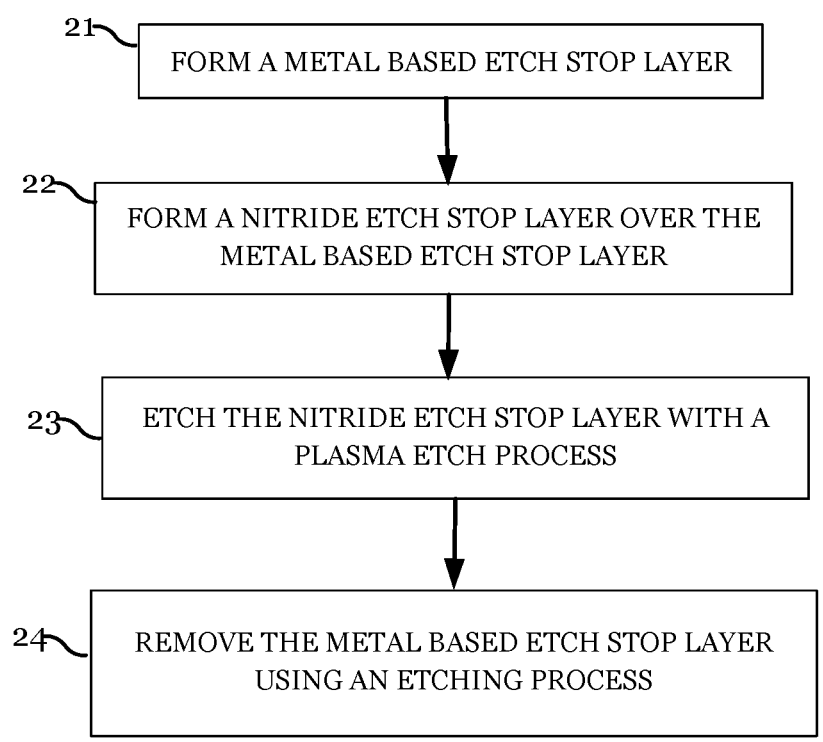
FIG. 2 illustrates a flow chart of a corresponding method of forming the semiconductor device.

A generic method of implementing a protective layer will be first described using FIGS. 1A-1B, 2. Detailed embodiments of a method of forming a semiconductor device will then be described using FIGS. 3A-10B and FIGS. 17A-17B. Alternate embodiments of the method of forming a semiconductor device will also then be described using FIGS. 11A-15B. Structural embodiments of the semiconductor device thus fabricated will be described using FIGS. 6A-6B, 10A-10B, and 16.

FIGS. 1A-1B illustrate a generic embodiment of a method of protecting a substrate from damage during plasma etching to form contacts in accordance with an embodiment of the present invention. FIG. 2 illustrates a flow chart of a corresponding method of forming the semiconductor device.

FIG. 1A illustrates a cross sectional representation of the semiconductor device 10 during fabrication in accordance with an embodiment of the present invention.

Semiconductor device 100 comprises a substrate 41 having a contact region 44. The contact region 44 may be a source/drain region of a transistor as an example but may be other regions or regions of other types of devices.

A protective layer 45 (e.g., a metal based etch stop layer) is formed selectively to serve as a protection layer for the underlying contact region 44. In various embodiments, the protective layer 45 may comprise metal oxides (MOx), metal nitrides (MNx), and metal oxynitrides such as, AlOx, AlN, TiOx, TiN, TaN etc., where the "M" represents an elemental metal such as aluminum, titanium, tantalum, and others.

In one or more embodiments, although the protective layer 45 is sacrificial, the protective layer 45 may be selected to be an insulating material to avoid unintentional shorting of different regions of the device by any remaining material of the protective layer 45.

In various embodiments, the protective layer 45 may be formed using an atomic layer deposition (ALD) processing technique, which helps to achieve a highly localized deposition profile.

Next, an etch stop layer 42, e.g., a nitride etch stop layer, is deposited across the entirety of the substrate 41, followed by a deposition of the inter layer dielectric 43. Both of these deposition processes may include standard deposition techniques, such a CVD, known to the art.

FIG. 1B illustrates a cross sectional view of the semiconductor device during a subsequent stage of fabrication in accordance with an embodiment of the present invention.

An opening 46 for forming a contact is formed exposing the etch stop layer 42. The etch stop layer 42 is then removed using a plasma etching process. However, the plasma etching process causes no damage to the underlying substrate 41 because of the protective layer 45.

After removing the etch stop layer 42, the protective layer 45 is removed using a gentler wet cleaning process rather than the plasma process. Examples of the clean process may include piranha or RCA clean.

Accordingly, embodiments of the present invention help to avoid plasma damage to underlying semiconductor regions such as a contact region 44.

Embodiments of the application may be applied to various types of devices such as Fin transistors as well as stacked memory devices. Specific embodiments of the above process will be described using FIGS. 3-10, 11-15, and 16 below.

Figure 3A:
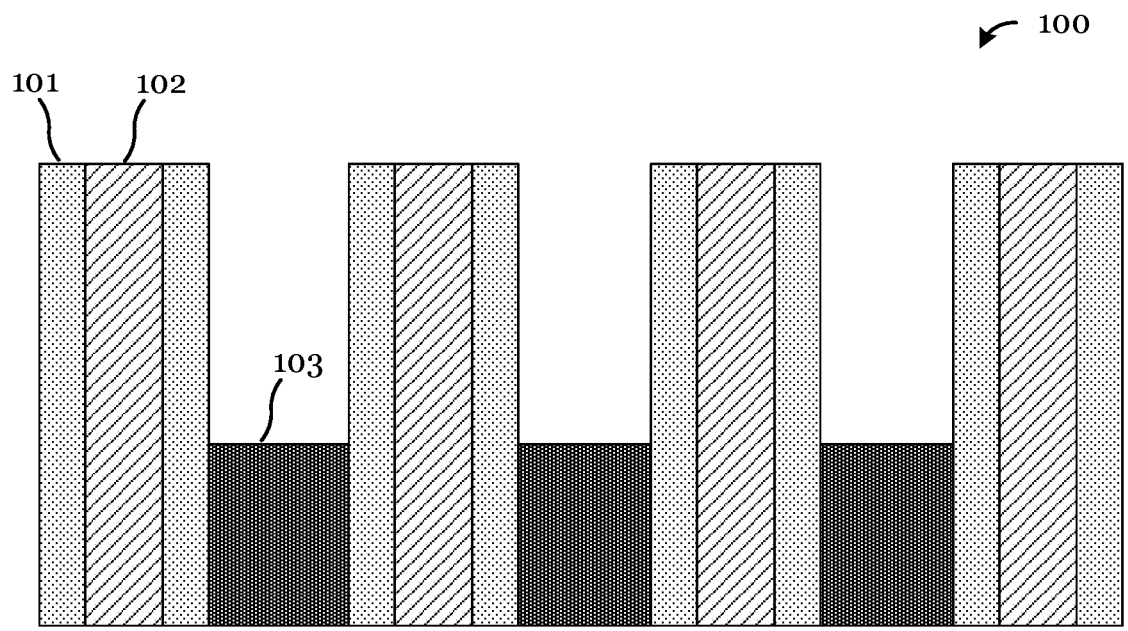
Figure 3B:
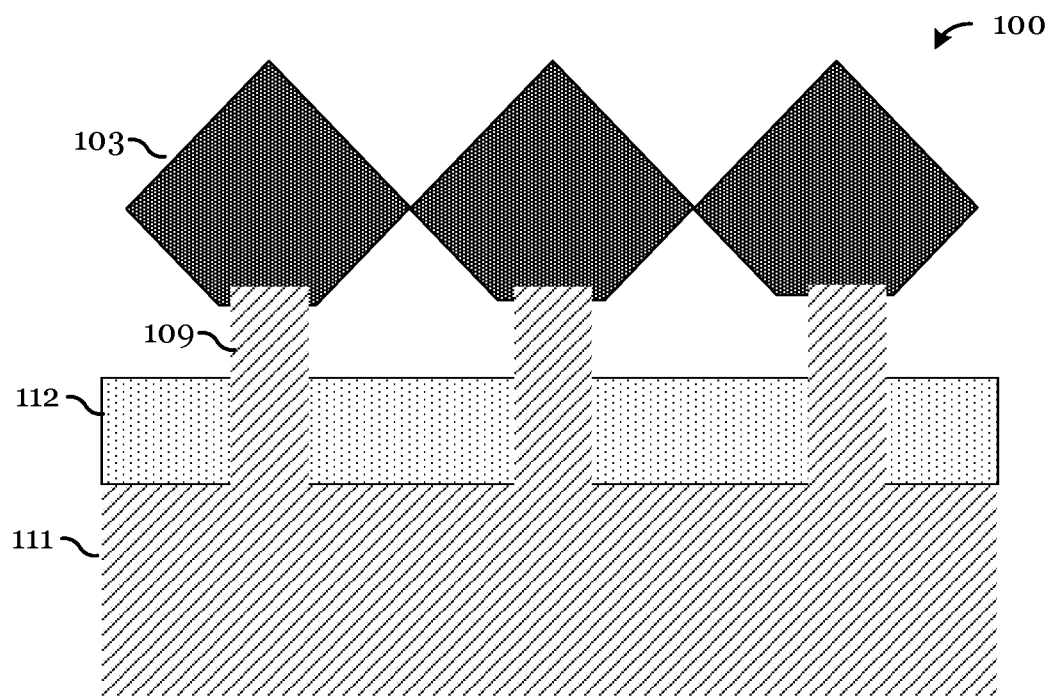
Figure 3C:
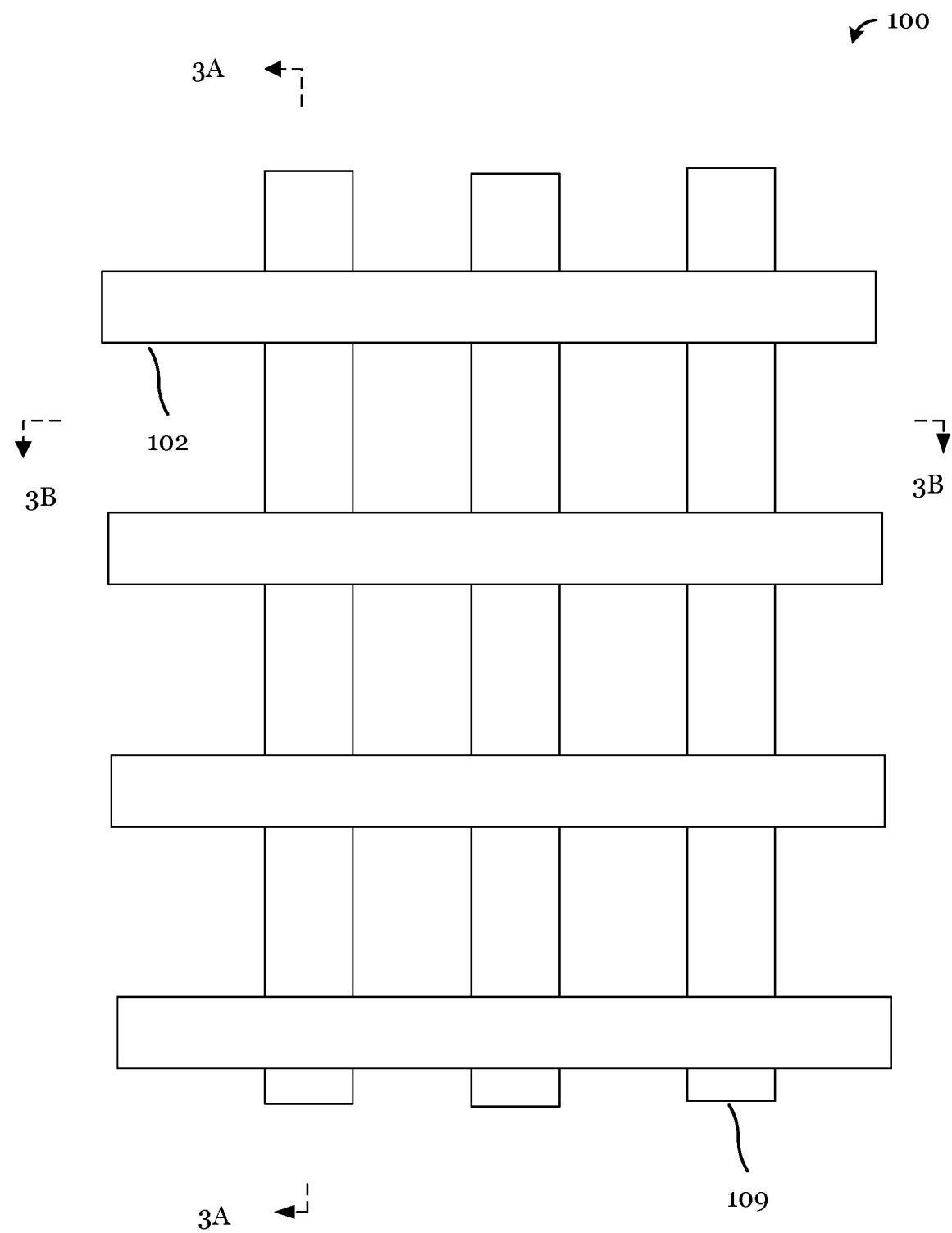
FIG. 3C illustrates a top view showing the cutline 3A-3A illustrated in FIG. 3A and cutline 3B-3B illustrated in FIG. 3B, all in accordance with an embodiment of the present invention.

FIG. 3A illustrates a partial cross sectional view of a semiconductor device during fabrication along a direction of a fin, wherein FIG. 3B shows a cross sectional view of the semiconductor device along a direction orthogonal to the direction of the fin, and wherein FIG. 3C illustrates a top view showing the cutline 3A-3A illustrated in FIG. 3A and cutline 3B-3B illustrated in FIG. 3B, all in accordance with an embodiment of the present invention. FIG. 3A is a partial cross sectional view and does not show the underlying fins and substrate.

As illustrated in FIGS. 3A-3C, at this stage of processing, the semiconductor device 100 has already gone through a substantial part of the front-end-of-the-line (FEOL) fabrication. For example, as illustrated in FIG. 3B, a transistor structure with a plurality of fins 109 is formed on the substrate 111.

In various embodiments, the substrate 111 may comprise silicon, silicon germanium, silicon carbide, and compound semiconductors such as gallium nitride, gallium arsenide, indium arsenide, indium phosphide, and others. The substrate 111 may comprise a semiconductor wafer that may include a semiconductor epitaxial layer including hetero epitaxial layers. For example, in one or more embodiments, one or more hetero epitaxial layers comprising a compound semiconductor may be formed over a semiconductor substrate. In various embodiments, a portion or an entirety of the substrate 111 may be amorphous, polycrystalline, or single-crystalline. In various embodiments, the substrate 111 may be doped, undoped, or contain both doped and undoped regions.

The plurality of fins 109 may be formed by epitaxial growth from the substrate 111 or alternatively using an etch back process leaving the plurality of fins 109. The plurality of fins 109 may be isolated from each other by shallow isolation regions 112. Accordingly, the shallow isolation regions 112 and the plurality of fins 109 may form an alternating pattern.

In one embodiment, the shallow isolation regions 112 may be formed by depositing an oxide fill material after patterning the plurality of fins 109, which is then planarized, for example, using a chemical mechanical planarization process. After a planarization, the shallow isolation regions 112 may be recessed so as to raise the plurality of fins 109.

A plurality of dummy gates 102 are formed over the substrate 111 and the plurality of fins 109. In one embodiment, the plurality of dummy gates 102 may be formed by patterning a layer of amorphous silicon or polysilicon deposited over the plurality of fins 109.

Next, a plurality of spacers 101 are formed on sidewalls of the plurality of dummy gates 102. The plurality of spacers 101 can be formed by depositing an insulating layer followed by an anisotropic etching process. For example, a reactive ion etch (RIE) process may be used to form the spacers 101. The material of the insulating layer is chosen to be selectively not etched during the removal of the plurality of dummy gates 102 later in the process, e.g., immune to etching by chemical such as TMAH or NH4OH.

Next, epitaxial regions 103 are grown over portions of the plurality of fins 109 located between the plurality of dummy gates 102 so as to form raised source/drain regions. The upper surface of the raised source/drain regions may form a faceted surface due to the growth pattern of the corresponding epitaxial material.

In one or more embodiments, the epitaxial regions 103 may be formed in a single epitaxial growth process. In other embodiments, the growth of the epitaxial regions 103 may consist of a multi-stage process. For example, it can begin with growing an initial epitaxial layer with a first doping on the plurality of fins 109 to a pre-determined thickness followed by the growth of a second layer with a second doping.

For example, the second doping may be higher than the first doping. Similarly, the different layer may have different compositions of e.g., germanium or other compounds. The epitaxial growth process may use any type of epitaxial process including molecular beam epitaxy (MBE), or various types of chemical vapor deposition (CVD).

In one or more embodiments, the epitaxial regions 103 may be grown to introduce strain into the plurality of fins 109, for example, due to lattice mismatch.

In one or more embodiments, the source/drain (S/D) regions may be formed by doping the regions of the fins and the epitaxial regions 103, for example, with an implantation/anneal process.

Figure 4A:
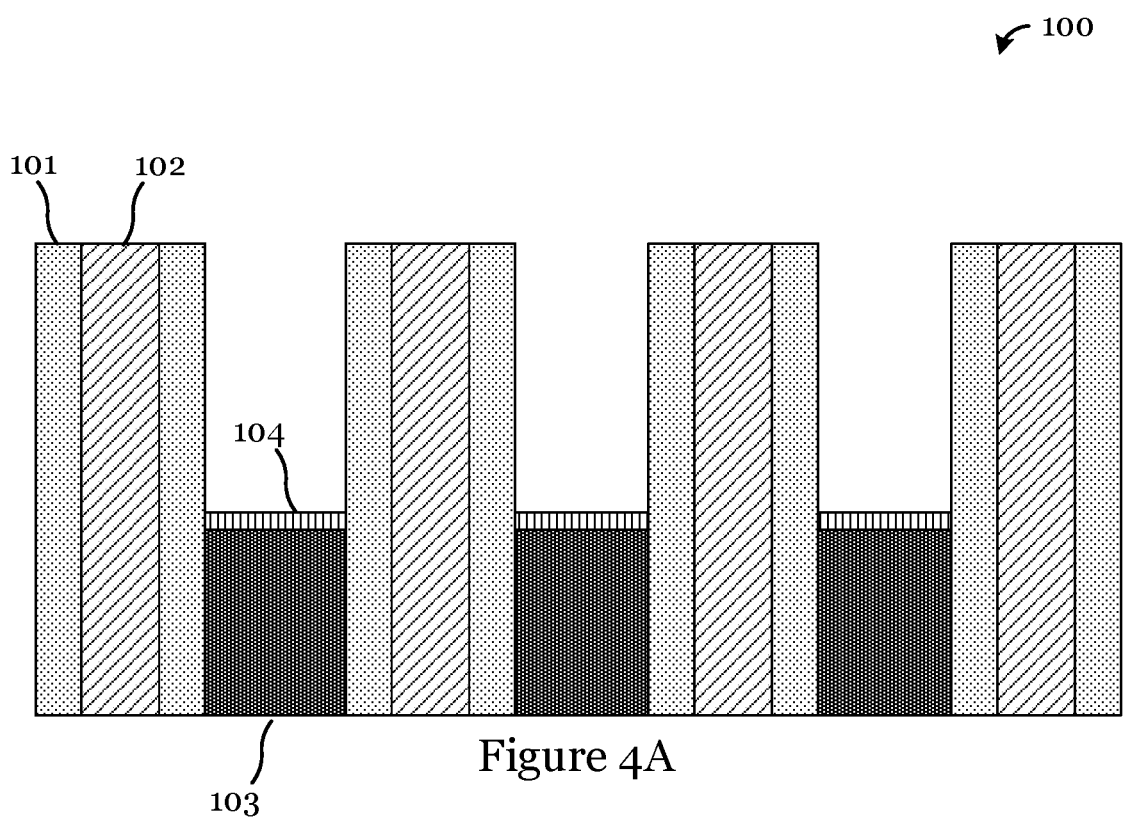
FIGS. 4A-4B illustrate partial cross sectional views of the semiconductor device during a subsequent stage of fabrication after forming a localized etch stop layer in accordance with an embodiment of the present invention.
Figure 4B:
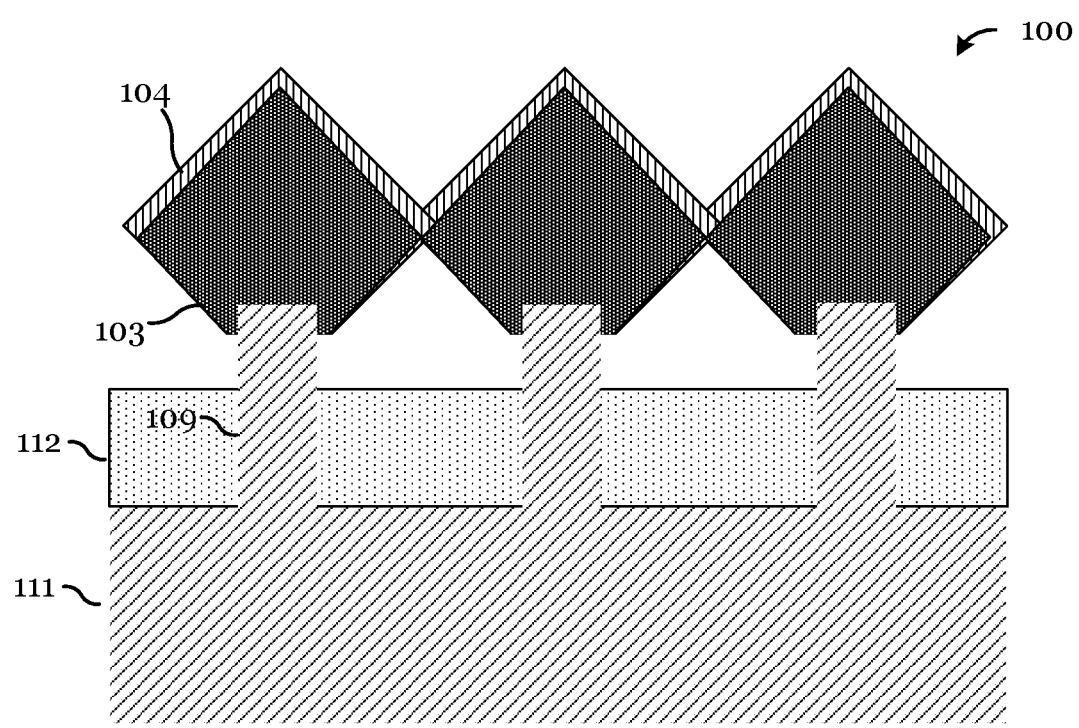

FIGS. 4A-4B illustrate a cross sectional view of the semiconductor device 100, during a subsequent stage of fabrication, after forming a localized etch stop layer (LESL) 104 over the epitaxial region 103 and after depositing a global etch stop layer (GESL) 105 in accordance with an embodiment of the present invention. FIG. 4A illustrates a cutline similar to FIG. 3A while FIG. 4B illustrates a cutline similar to FIG. 3B.

In various embodiments of semiconductor device 100, the LESL 104 is selected so as to be extremely selective during plasma etching to dielectric materials such as SiO2 and Si3N4. Therefore, the LESL 104 serves as a robust protection layer during dry etching techniques that use plasma processing. Including the LESL 104 in the process flow preserves the integrity of epitaxial region 103. Damaged epitaxial region 103 causing poor device performance can thus be mitigated.

In various embodiments, the LESL 104 can include either metal oxides (MOx), metal nitrides (MNx), and metal oxynitrides such as, AlOx, AlN, TiN, TiOx, etc., where the "M" represents an elemental metal such as aluminum, titanium, tantalum, and others. In one or more embodiments, although the LESL 104 is sacrificial, the LESL 104 is an insulating material to avoid unintentional shorting of different regions of the device by any remaining material of the LESL 104. Therefore, silicides are not used as the LESL 104 because they are typically conductive.

In various embodiments, the LESL 104 may have a thickness ranging from 0.5 nm to about 10 nm. In one embodiment, the LESL 104 may have a thickness ranging from 2 nm to about 5 nm.

In one embodiment of the semiconductor device 100, the LESL 104 is formed using an atomic layer deposition (ALD) processing technique, which helps to achieve a highly localized deposition profile. In other embodiments, the LESL 104 may be formed using a selective deposition process that may include a chemical vapor deposition process such as metal-organic CVD (MOCVD) and other such processes.

In various embodiments, the LESL 104 is formed to completely cover and directly contact the epitaxial region 103.

In one embodiment, the thickness of LESL 104 next to spacer 101 may be more than the thickness of the LESL 104 in a central region. Thus, even if a little sidewall thickness of the spacers 101 is lost during etching, the underlying epitaxial region 103 remains protected. This may help to avoid yield loss due to lateral undercutting by the etchants from the plasma.

The GESL 105 is conformally deposited across the entire wafer surface. In various embodiments, the GESL 105 is formed to completely cover and directly contact the LESL 104. In various embodiments, the GESL 105 comprises silicon nitride, silicon oxide, or silicon oxynitride. In other embodiments, the GESL 105 may comprise other nitrides including metal nitrides as well as oxynitrides. But similar to the LESL 104, the GESL 105 cannot be conductive, which would otherwise short the various devices being fabricated.

In various embodiments, the GESL 105 has a thickness ranging from about 10 nm to about 50 nm. Typically an aggressive plasma etchant process is used subsequently to remove the GESL 105 so as to expose a top surface of the epitaxial region 103 for contact formation. However, without the LESL 104, the plasma process may also damage the underlying epitaxial region 103. Advantageously, in various embodiments, because the GESL 105 is deposited over the LESL 104, the LESL 104 protects the underlying surface of the epitaxial region 103 during subsequent plasma processing.

Figure 5A:
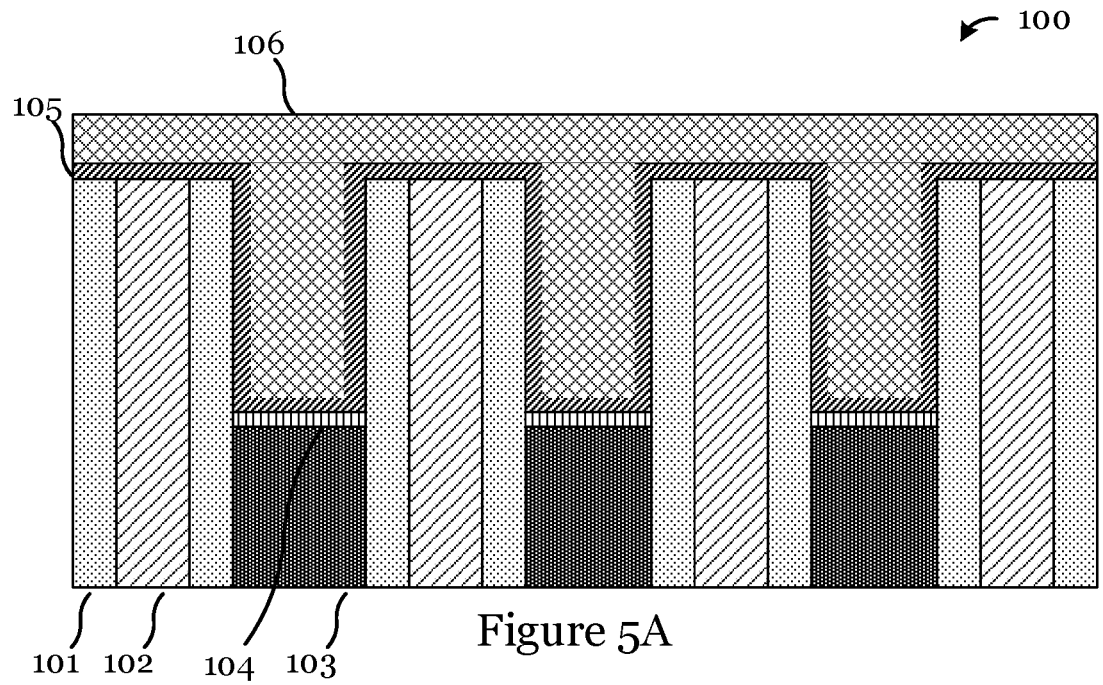
FIGS. 5A-5B illustrate partial cross sectional views of the semiconductor device during a subsequent stage of fabrication, after depositing a global etch stop layer (GESL) and after depositing an oxide in accordance with an embodiment of the present invention.
Figure 5B:
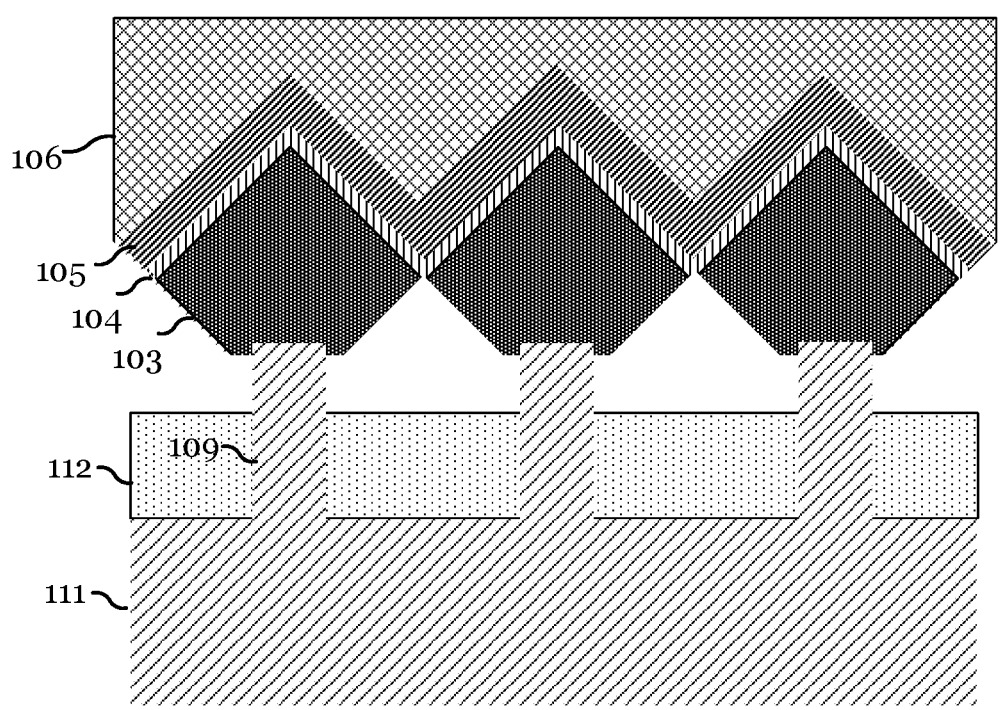

FIGS. 5A-5B illustrate partial cross sectional views of the semiconductor device 100 during fabrication after depositing an oxide 106 in accordance with an embodiment of the present invention. FIG. 5A illustrates a cutline similar to FIG. 3A while FIG. 5B illustrates a cutline similar to FIG. 3B.

Referring to FIGS. 5A and 5B, an oxide 106 is filled between the plurality of dummy gates 102. The oxide 106 is overfilled above the top surface of the GESL 105 and over the plurality of dummy gates 102.

In various embodiments of semiconductor device 100, the oxide 106 may be a flowable oxide including spin-on-glass. In one example, a layer comprising borophosphosilicate glass (BPSG), phosphosilicate glass (PSG), borosilicate glass (BSG), arsenic-silicon glass (ArSG), or other types of glass may be deposited and heated to reflow. In one or more embodiments, the oxide 106 may also comprise an oxide such as tetra ethyl oxysilane (TEOS), fluorinated TEOS (FTEOS), organo silicate glass (OSG), fluorinated silicate glass (FSG), or a spin-on glass (SOG).

Figure 6A:
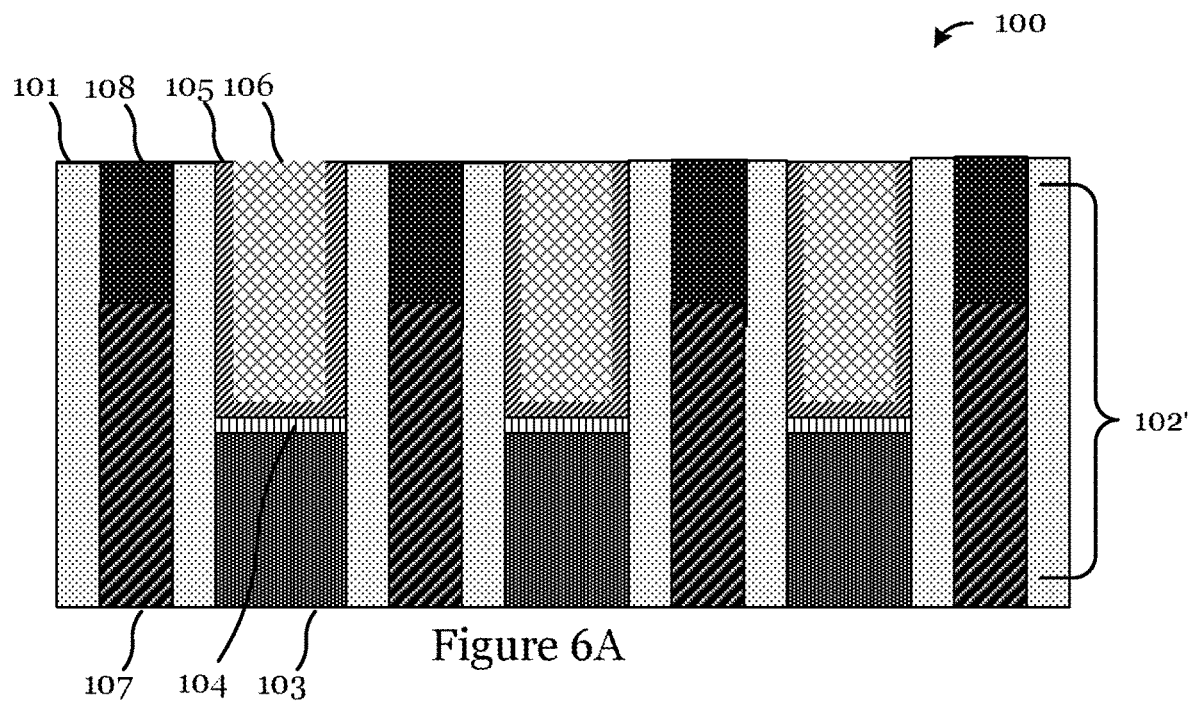
FIGS. 6A-6B illustrate partial cross sectional views of the semiconductor device during fabrication after forming a replacement metal gate (RMG) in accordance with an embodiment of the invention.
Figure 6B:
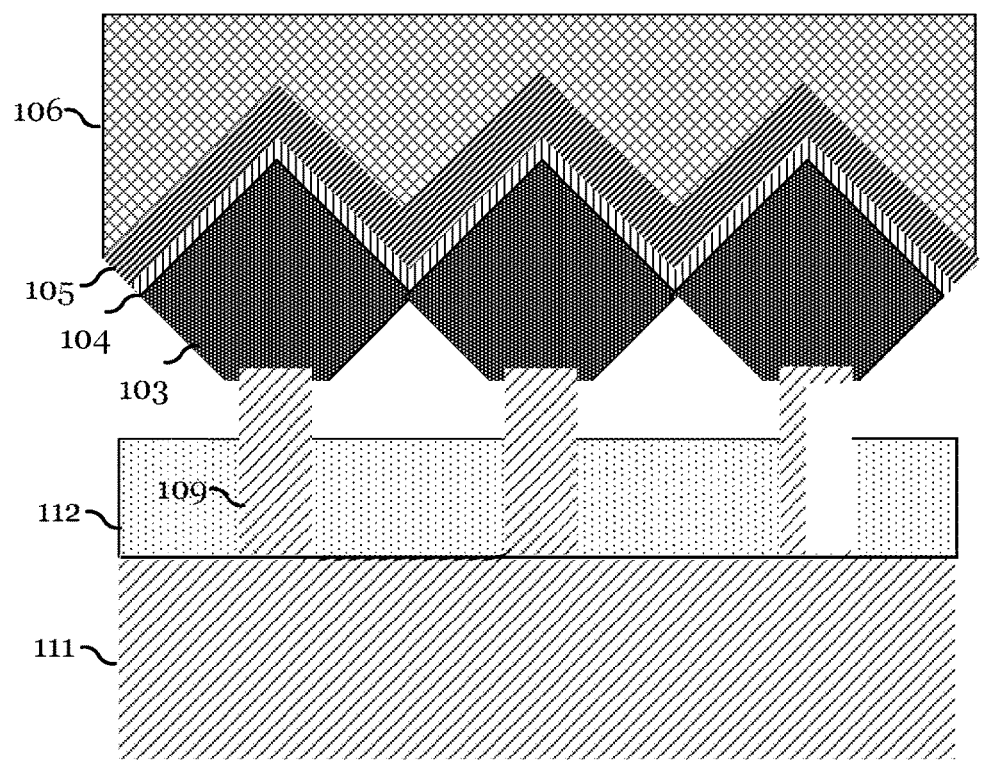

FIGS. 6A-6B illustrate a cross sectional view of the semiconductor device 100 during fabrication after forming a replacement metal gate (RMG) in accordance with an embodiment of the invention. FIG. 6A illustrates a cutline similar to FIG. 3A while FIG. 6B illustrates a cutline similar to FIG. 3B.

As illustrated in FIGS. 6A and 6B, the oxide 106 is planarized to expose the underlying GESL 105. The GESL 105 may be removed using an anisotropic etching process to expose the plurality of dummy gates 102. The plurality of dummy gates 102 is then removed, e.g., using a wet etch process or alternatively a plasma process. The spacer 101 retains the shape of the gate stack during the removal of the plurality of dummy gates 102. During the etching process, the oxide 106 protects the underlying regions of the epitaxial region 103.

After removing the plurality of dummy gates 102, the inner sidewalls of the plurality of spacers 101 are exposed leaving a cavity. This cavity is filled with a replacement gate material 107. After the replacement gate material 107 is in place, a contact cap 108 is formed. The contact cap 108 may be formed using a self-aligned process so as to form selectively only over the replacement gate material 107.

The replacement gate material 107 along with the contact cap 108 form the replacement metal gate (RMG) stack 102'. The RMG stack 102' helps to set the work function of the gate and forms the final gate electrode of the semiconductor device 100.

Figure 7A:
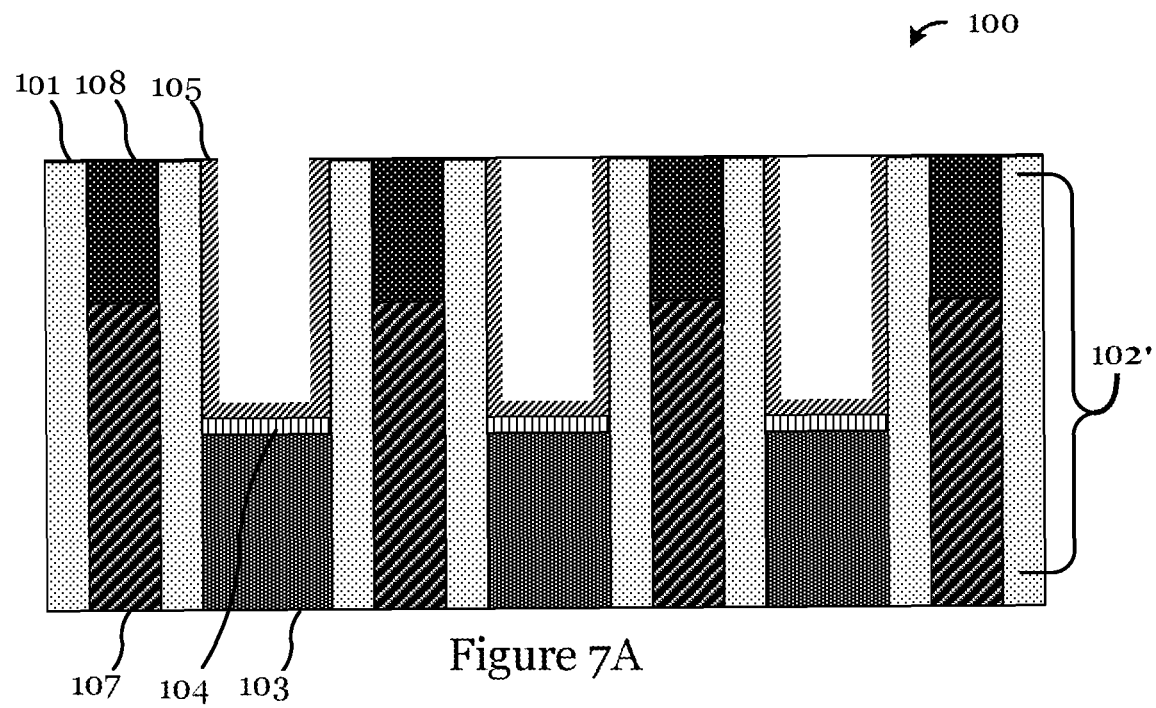
FIGS. 7A-7B illustrate partial cross sectional views of the semiconductor device during a next stage of fabrication after removing the oxide in accordance with an embodiment of the present invention.
Figure 7B:
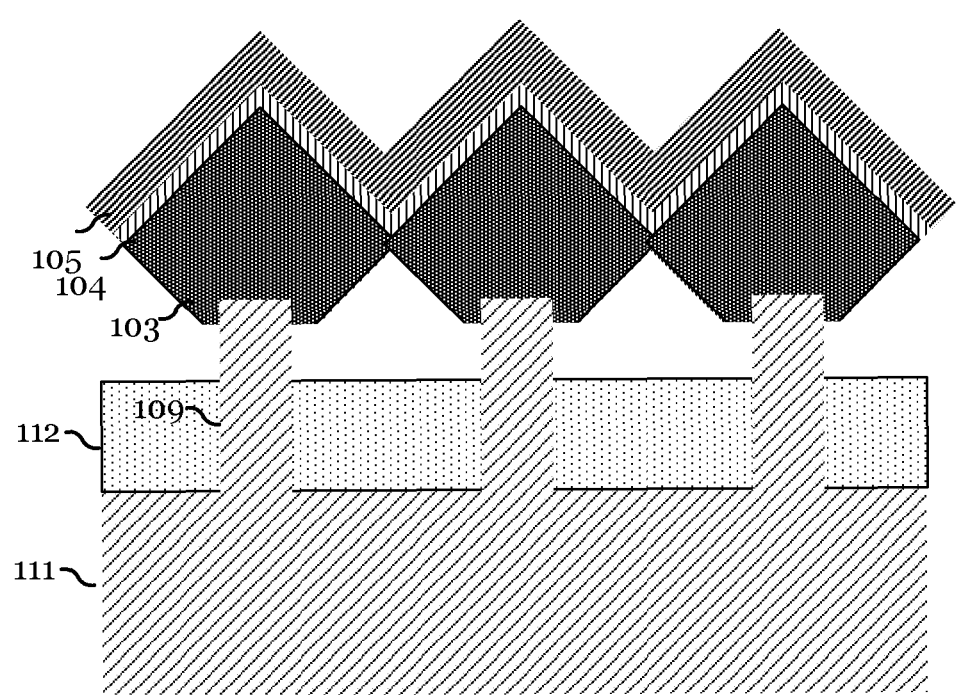

FIGS. 7A-7B illustrate partial cross sectional views of the semiconductor device 100 during a next stage of fabrication, after removing the oxide 106, in accordance with an embodiment of the present invention. FIG. 7A illustrates a cutline similar to FIG. 3A while FIG. 7B illustrates a cutline similar to FIG. 3B.

As illustrated in FIG. 7A, the oxide 106 is removed leaving empty, unfilled trenches behind. In various embodiments, the oxide etch process may be a wet etch process, or a dry etch process such as reactive ion etch (RIE), or any process currently known within the art of semiconductor manufacturing. Etching the oxide 106 exposes the GESL 105 remaining between the plurality of spacers 101 that line the replacement gate material 107 and the contact cap 108.

Figure 8A:
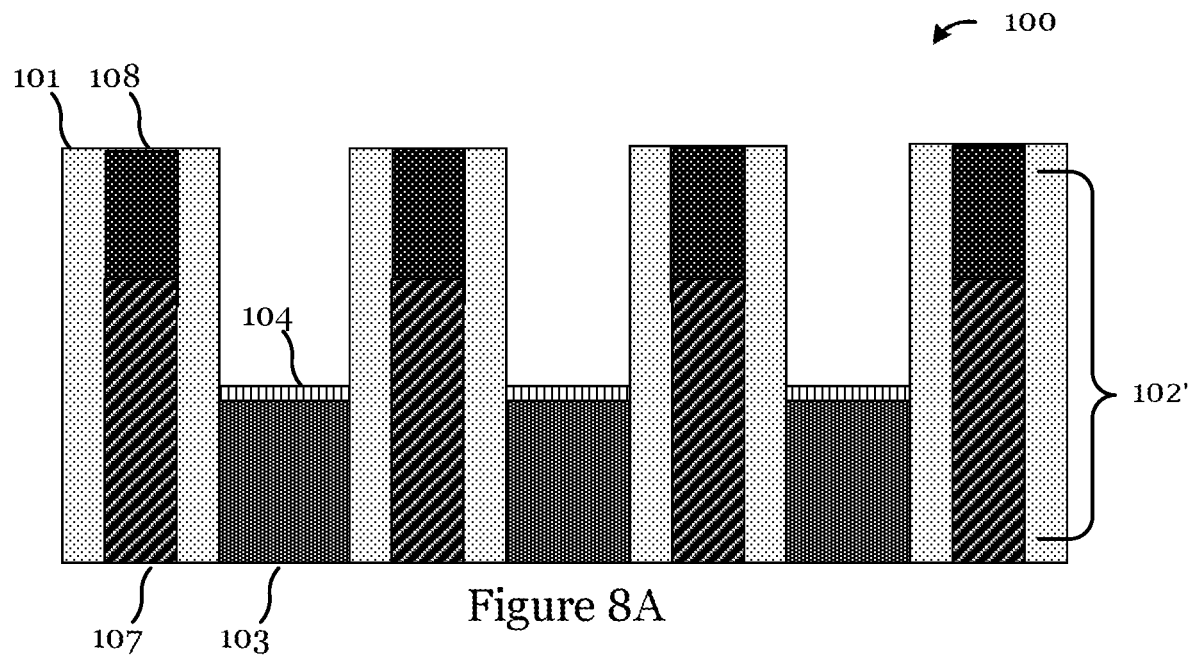
FIGS. 8A-8B illustrate partial cross sectional views of the semiconductor device during a next stage of fabrication after removing the GESL in accordance with an embodiment of the present invention.
Figure 8B:
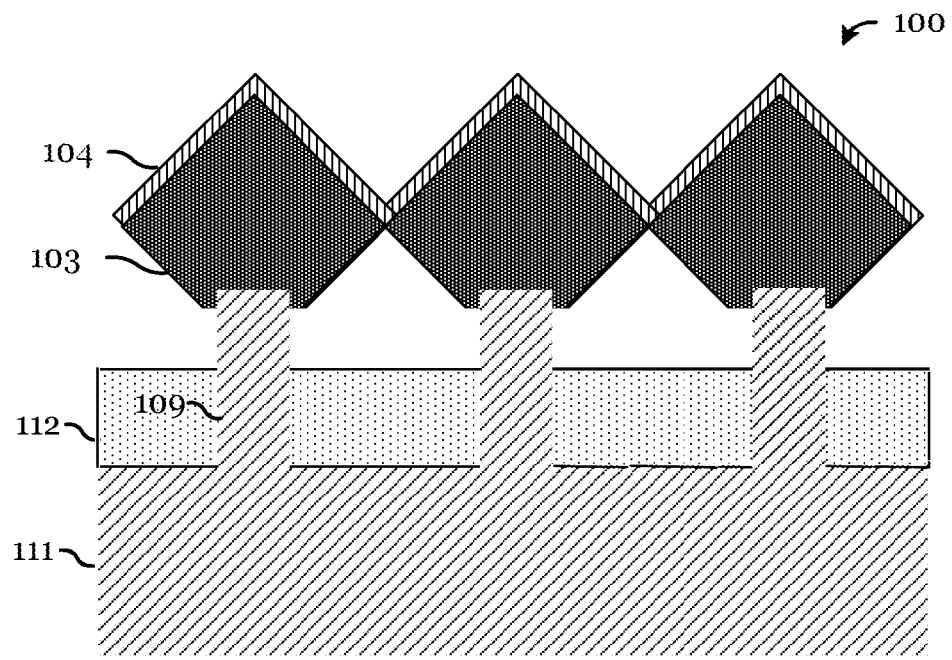

FIGS. 8A-8B illustrate partial cross sectional views of the semiconductor device 100 during a next stage of fabrication, after removing the GESL 105, in accordance with an embodiment of the present invention. FIG. 8A illustrates a cutline similar to FIG. 3A while FIG. 8B illustrates a cutline similar to FIG. 3B.

The exposed GESL 105 is removed as illustrated in FIGS. 8A-8B. In various embodiments, the GESL 105 is removed using a plasma process such as a reactive ion etching (RIE) process. As described earlier, the LESL 104 is immune from being etched during the plasma process, or in other words has a very low etching rate compared to the GESL 105. In one or more embodiments, the etching rate of the LESL 104 to the etching rate of the GESL 105 when exposed to this etching process is between 1:10 to 1:1000, and about 1:50 to 1:200 in one embodiment. Therefore, the LESL 104 etches at least ten times slower than the GESL 105.

Thus, the plasma process is safely stopped at the LESL 104, which protects the underlying epitaxial regions 103 of the semiconductor device 100 from plasma damage. At this stage, once the GESL 105 is removed, the resulting structure of the semiconductor device 100 comprises the epitaxial region 103, the LESL 104, and the RMG stack 102', which further comprises the replacement gate material 107 and the contact cap 108.

Figure 9A:
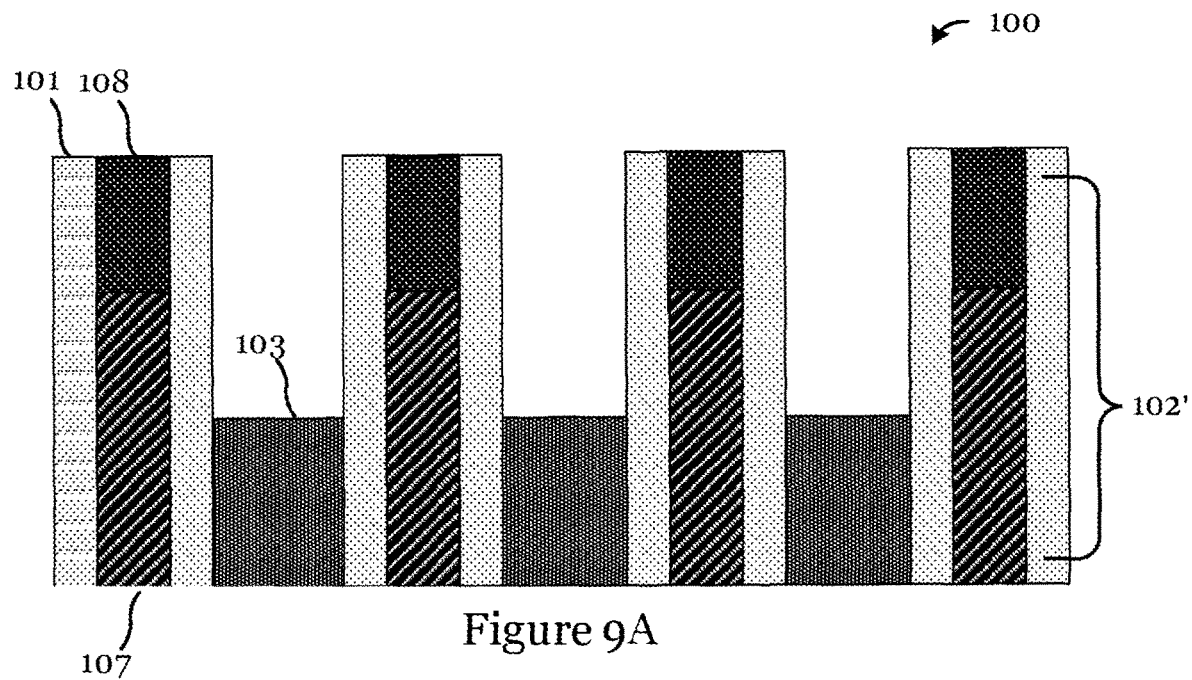
FIGS. 9A-9B illustrate partial cross sectional views of the semiconductor device during a next stage of fabrication after removing the localized etch stop layer in accordance with an embodiment of the present invention.
Figure 9B:
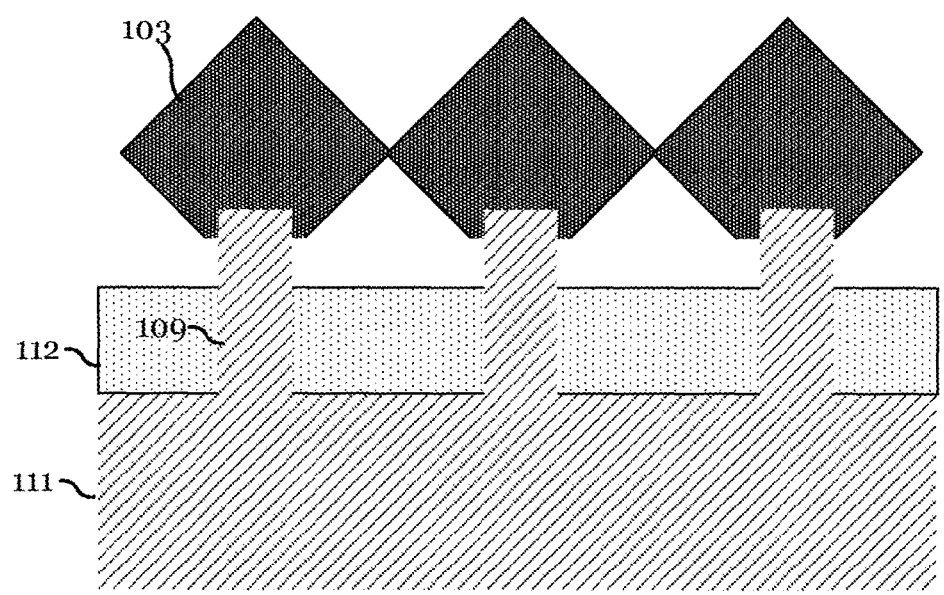

FIGS. 9A-9B illustrate a cross sectional view of the semiconductor device 100 during a next stage of fabrication, after removing the localized etch stop layer, in accordance with an embodiment of the present invention. FIG. 9A illustrates a cutline similar to FIG. 3A while FIG. 9B illustrates a cutline similar to FIG. 3B.

As next illustrated in FIGS. 9A-9B, in various embodiments, a wet cleaning process may be used to safely remove the LESL 104 from above the epitaxial region 103. Since the wet cleaning is a chemical etch process, a highly selective etching process may be used that removes only the LESL 104 without damaging the epitaxial regions 103.

In various embodiments, the wet cleaning process may use a chemical solution that has an affinity to the MOx or MNx material so as to safely remove the LESL 104 without affecting any neighboring semiconductor-based (e.g., Si) material.

Examples of the wet cleaning process may include piranha etch, Radio Corporation of America clean—more commonly known simply as RCA clean, other gentle etch chemistries comprising diluted content of deionized water, ammonia water, hydrogen peroxide, hydrochloric acid, and hydrofluoric acid.

The localized etch stop layer is completely removed after this process step. However, in some embodiments or in some structures with large isolated transistors, it is possible that some or all of the localized etch stop layer 104 is not removed. This does not cause any yield issues as the localized etch stop layer 104 is an insulating material. If the process can be ensured to remove all of the localized etch stop layer 104, the material of the localized etch stop layer 104 can be selected to be a conductive material.

Figure 10A:
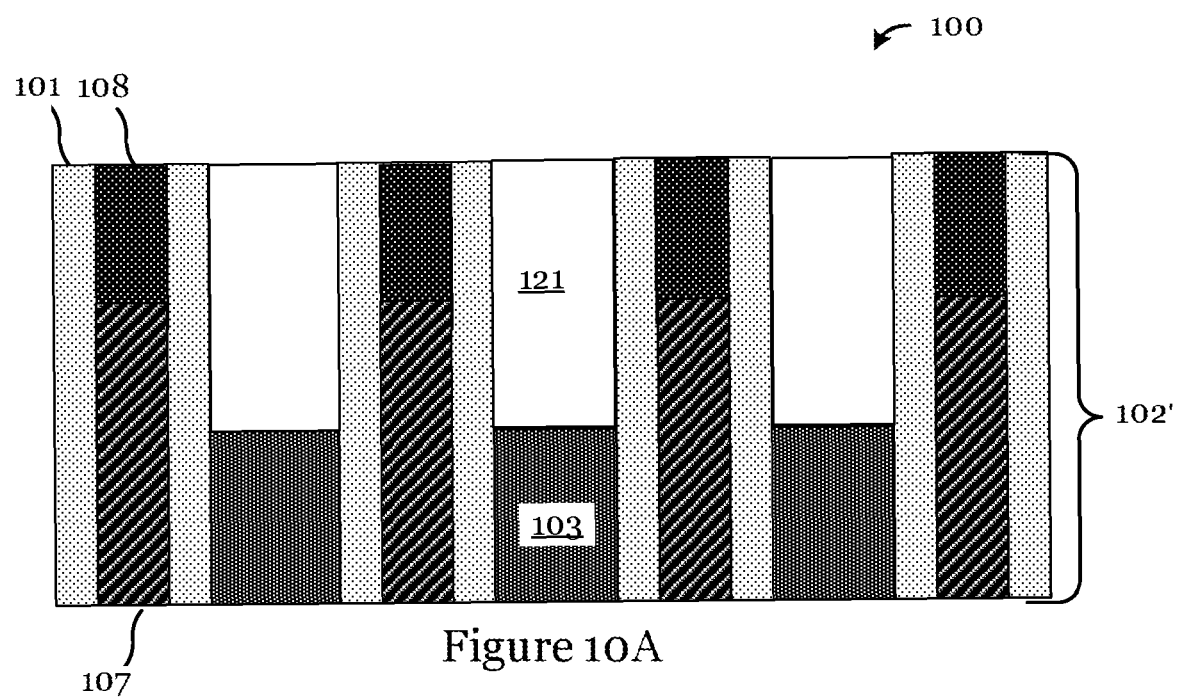
FIGS. 10A-10B illustrate partial cross sectional views of the semiconductor device during a next stage of fabrication after forming contact plugs in accordance with an embodiment of the present invention.
Figure 10B:
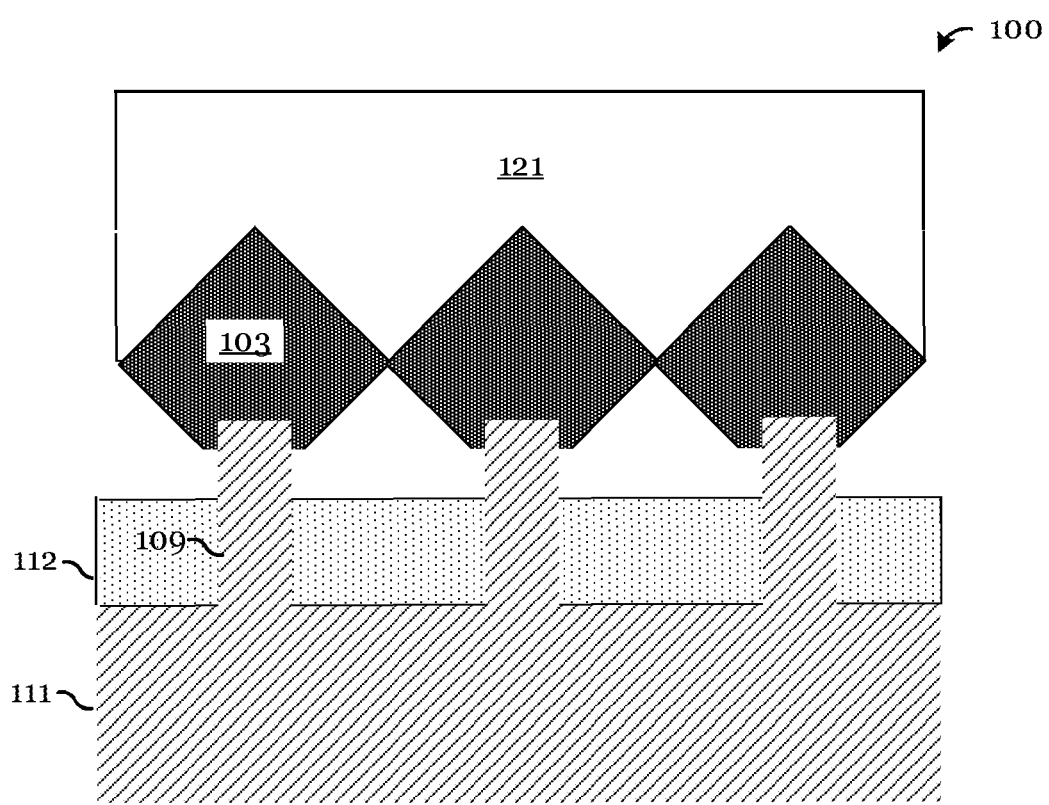

FIGS. 10A-10B illustrate a partial cross sectional view of the semiconductor device 100 during a next stage of fabrication, after forming contact plugs, in accordance with an embodiment of the present invention. FIG. 10A illustrates a cutline similar to FIG. 3A while FIG. 10B illustrates a cutline similar to FIG. 3B.

After the removal of the LESL 104, subsequent processing may proceed as in conventional semiconductor manufacturing. For example, a contact forming material may be deposited through the contact opening to form a contact plug 121 to the epitaxial region 103. Examples of material for the contact include silicide forming metals and other conductive materials.

An alternate embodiment of a method to form a local etch stop layer will now be described using FIGS. 11A-15B. In this embodiment, the local etch stop layer is formed using a combination of a blanket deposition and etch process instead of the selective deposition described in the prior embodiment. This process may start similar to the prior embodiment, for example, as described in FIGS. 3A-C but an alternative to FIG. 4A-4B is described below.

Figure 11A:
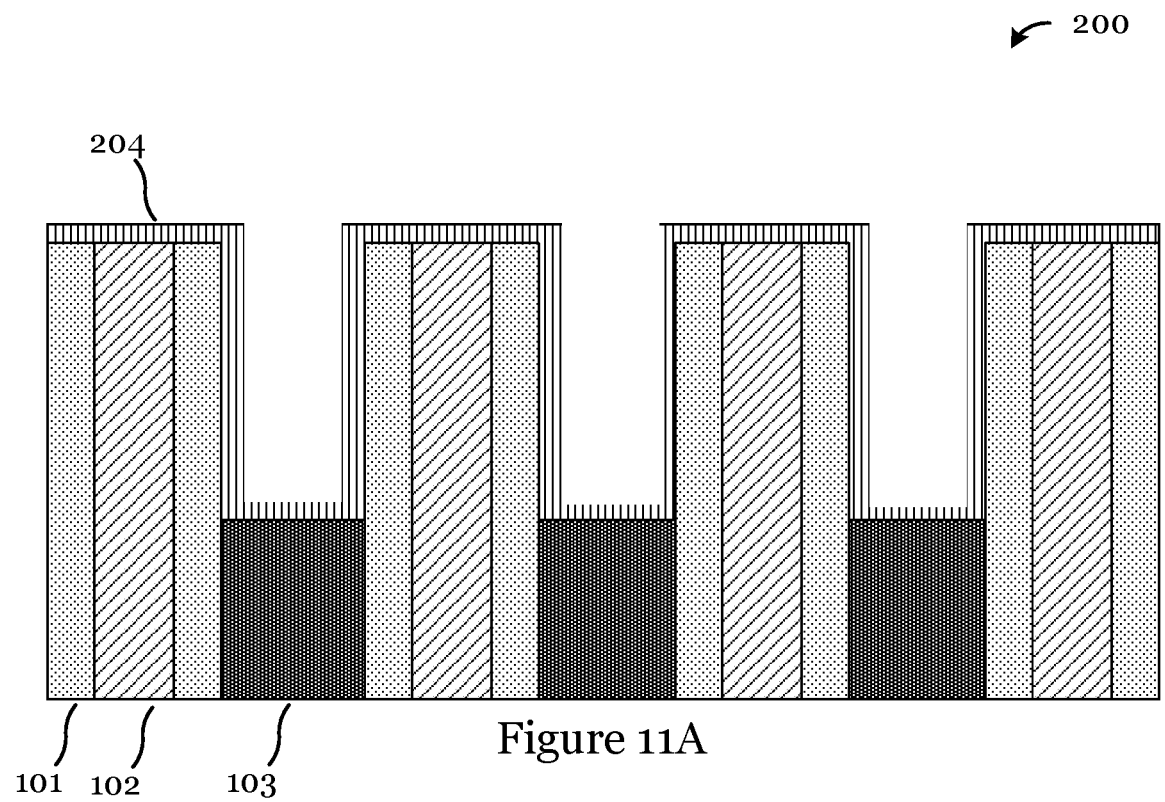
FIGS. 11A-11B illustrate partial cross sectional views of a semiconductor device during fabrication, after depositing an etch stop layer across the entire device, in accordance with an embodiment of the present invention.
Figure 11B:
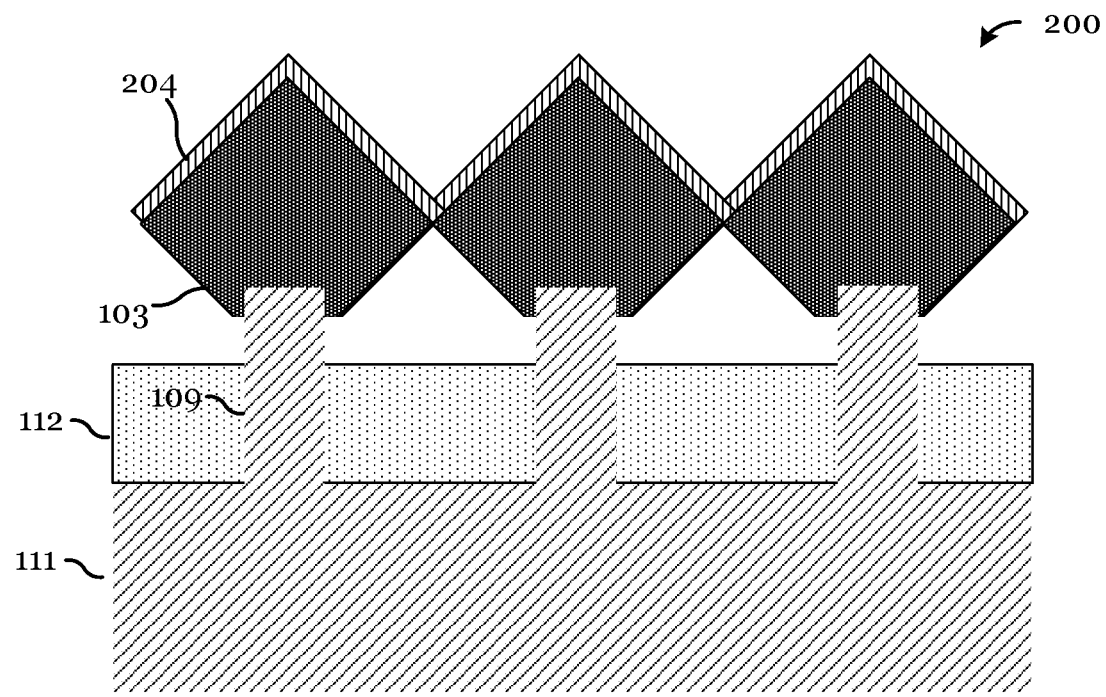

FIGS. 11A-11B illustrate partial cross sectional views of a semiconductor device during fabrication, after depositing an etch stop layer across the entire device, in accordance with an embodiment of the present invention. FIG. 11A illustrates a cutline similar to FIG. 3A while FIG. 11B illustrates a cutline similar to FIG. 3B.

In alternative embodiments for fabricating a semiconductor device 200, a etch stop layer 204 is deposited across the entire surface of the substrate 111. Using this alternate technique, the etch stop layer 204 is not only deposited on the top of the epitaxial region 103, but is globally deposited, in a conformal manner, over the entire wafer. In one or more embodiments, the etch stop layer 204 may be deposited using atomic layer deposition process that is not selective. In other embodiments, the etch stop layer 204 may also be deposited using chemical vapor deposition, plasma vapor deposition, sputtering, and other deposition techniques.

Similar to the LESL 104 in the prior embodiments, the etch stop layer 204 may comprise a metal nitride or metal oxide such AlN, TiN, and others, in particular materials that have a highly etch selectivity with the subsequently deposited GESL 105 when exposed to plasma etching. The thickness of the etch stop layer 204 may be selected as discussed in the earlier embodiments for the LESL 104.

Thus, the etch stop layer 204 is deposited above the plurality of dummy gates 102 and above the source/drain region (located in between the plurality of dummy gates 102).

Figure 12A:
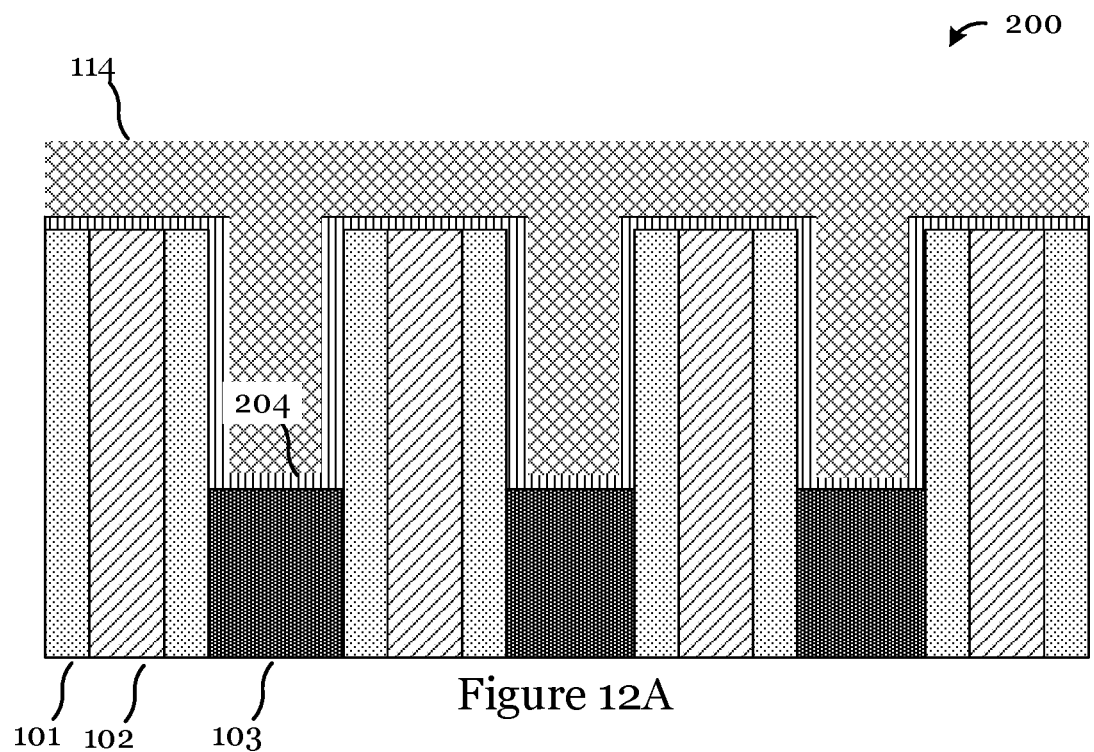
FIGS. 12A-12B illustrate partial cross sectional views of the semiconductor device during a subsequent stage of fabrication after depositing an organic fill material in accordance with an embodiment of the present invention.
Figure 12B:
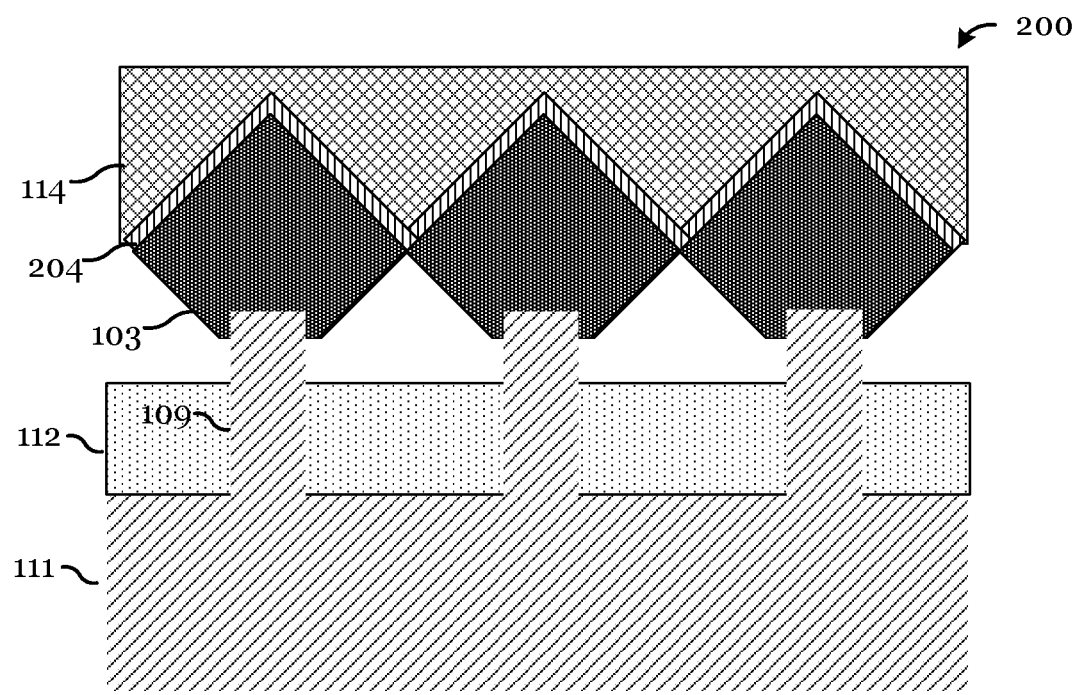

FIGS. 12A-12B illustrate partial cross sectional views of the semiconductor device 200, during a subsequent stage of fabrication, after depositing an organic fill material in accordance with an embodiment of the present invention. FIG. 12A illustrates a cutline similar to FIG. 3A while FIG. 12B illustrates a cutline similar to FIG. 3B.

As next illustrated in FIGS. 12A-12B, an organic fill 114 is deposited over the etch stop layer 204. The organic fill 114 completely fills the trenches between the plurality of dummy gates 102, and is over filled so that it extends past the top surface of the plurality of dummy gates 102.

In various embodiments of the semiconductor device 200, the organic fill 114 material can be comprised of organic photoresist, antireflective coating (ARC), epoxy, or any other organic material known to the state of the art. The organic fill 114 may be deposited using a coating process or other deposition process. A low temperature curing process may be performed after depositing the organic fill 114 in some embodiments.

Figure 13A:
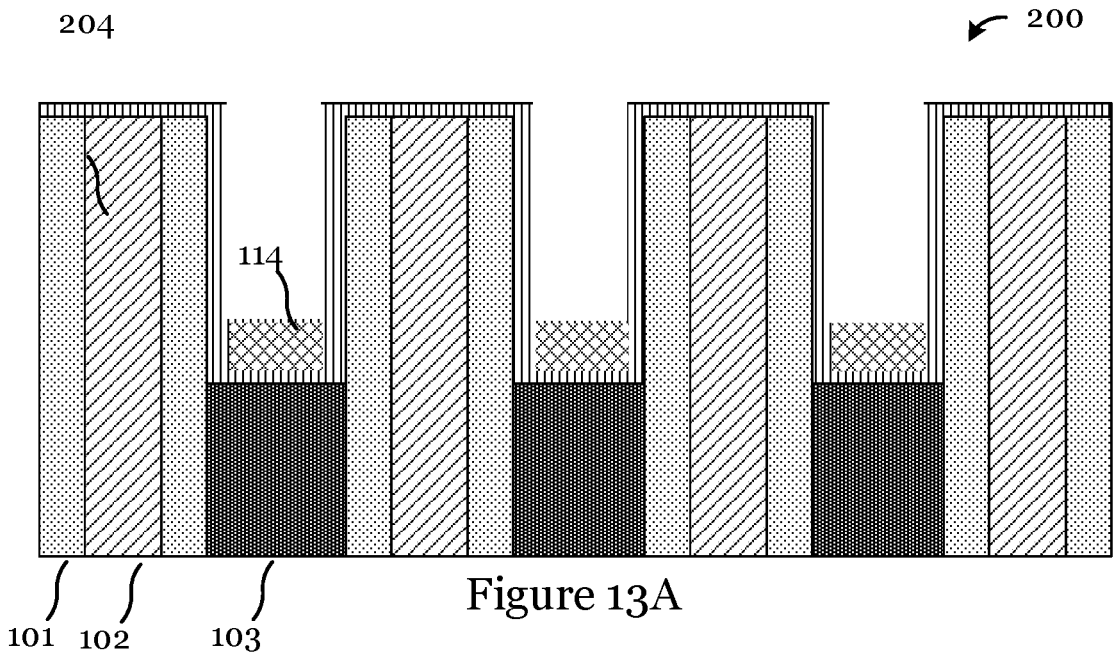
FIGS. 13A-13B illustrate partial cross sectional views of the semiconductor device, during a subsequent stage of fabrication, after an organic planarization layer etch back process, in accordance with an embodiment of the present invention.
Figure 13B:
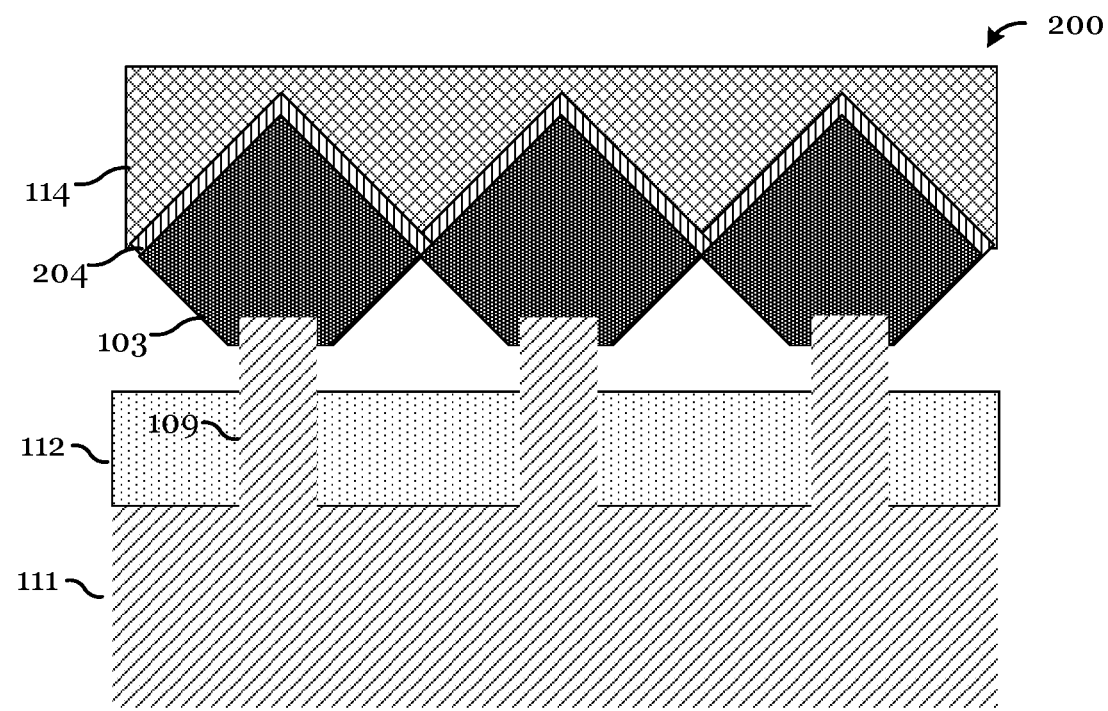

FIGS. 13A-13B illustrate partial cross sectional views of the semiconductor device 200, during a subsequent stage of fabrication, after an organic planarization layer (OPL) etch back process, in accordance with an embodiment of the present invention. FIG. 13A illustrates a cutline similar to FIG. 3A while FIG. 13B illustrates a cutline similar to FIG. 3B.

During this process, a planarization process followed by an etch-back process may be performed leaving a portion of the organic fill 114. After the planarization process, the organic fill 114 is present only within the trenches between the spacers 101. An etch-back process, for example, a timed etch process may then be used to remove a portion of the organic fill 114 in the trench. After the etch-back process, the remaining portion of the organic fill 114 exposes a portion of the etch stop layer 204 on the sidewalls of the trench. However, a bottom portion of the etch stop layer 204 remains protected by the remaining portion of the organic fill 114. Thus, the remaining portion of the organic fill 114 is then used as an etch mask while etching the etch stop layer 204 in the next step.

Figure 14A:
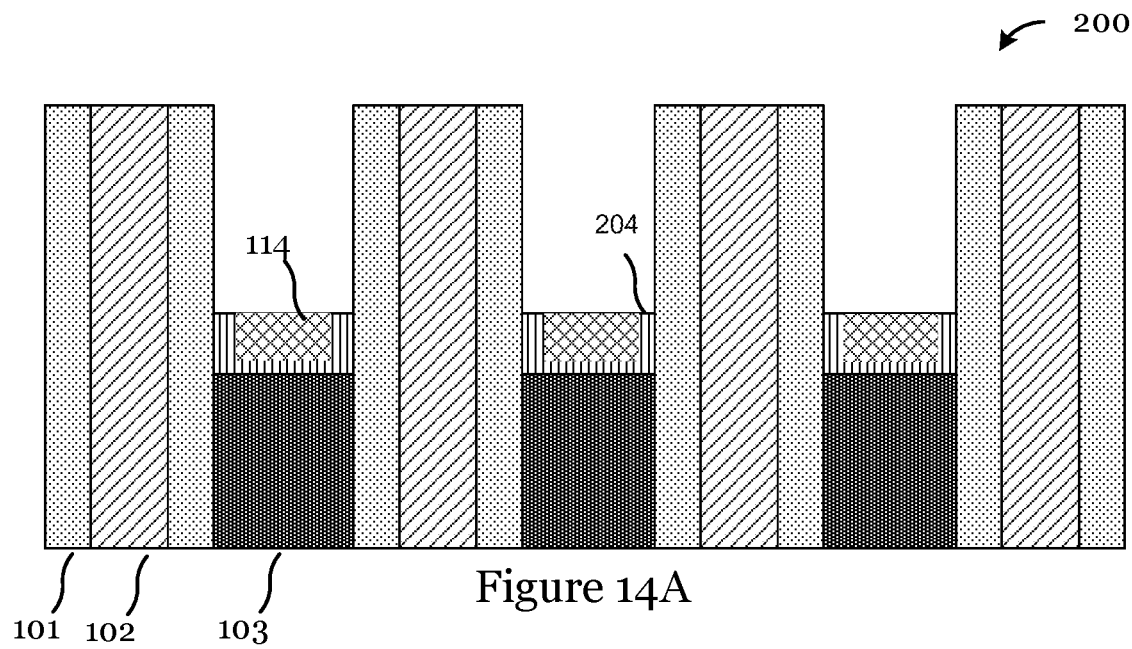
FIGS. 14A-14B illustrate partial cross sectional views of the semiconductor device, during a subsequent stage of fabrication, after a wet cleaning process in accordance with an embodiment of the present invention.
Figure 14B:
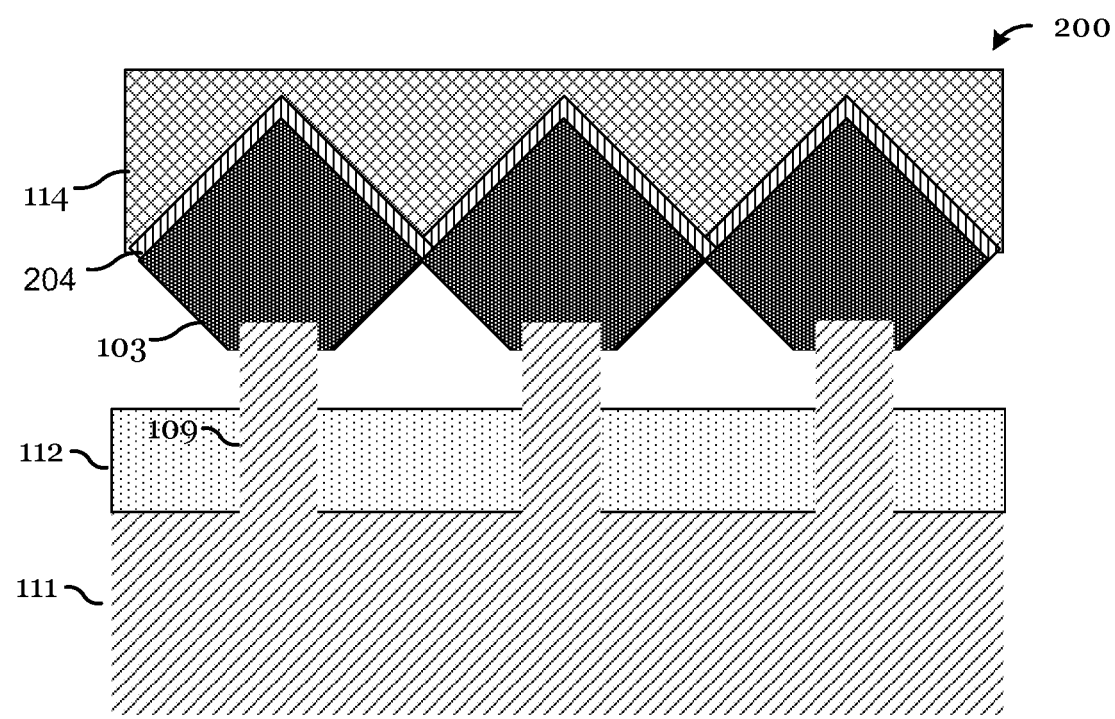

FIGS. 14A-14B illustrate a cross sectional view of the semiconductor device 100, during a subsequent stage of fabrication, after a wet cleaning process to remove the exposed etch stop layer from the top surface and sidewalls of the plurality of dummy gates in accordance with an embodiment of the present invention. FIG. 14A illustrates a cutline similar to FIG. 3A while FIG. 14B illustrates a cutline similar to FIG. 3B.

With the remaining portion of the organic fill 114 an etch mask, the exposed etch stop layer 204 is etched. For example, in one embodiment, the etch stop layer 204 may be etched using a wet clean chemistry such as a piranha etch and RCA clean.

Figure 15A:
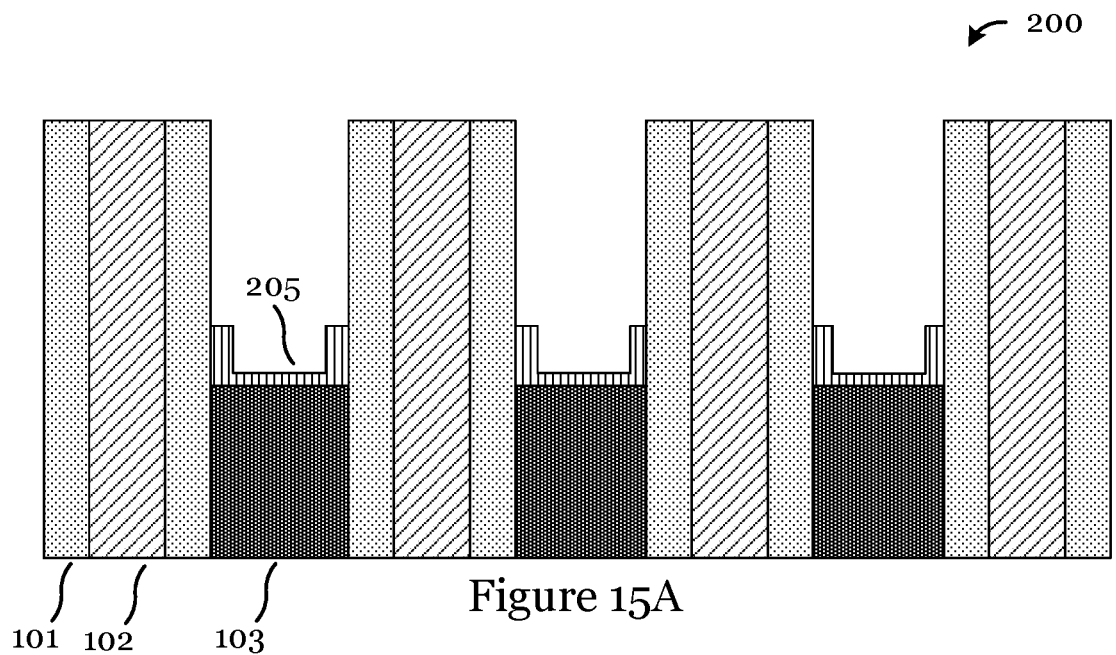
FIGS. 15A-15B illustrate partial cross sectional views of the semiconductor device, during a subsequent stage of fabrication, after removing the organic fill material, in accordance with an embodiment of the present invention.
Figure 15B:
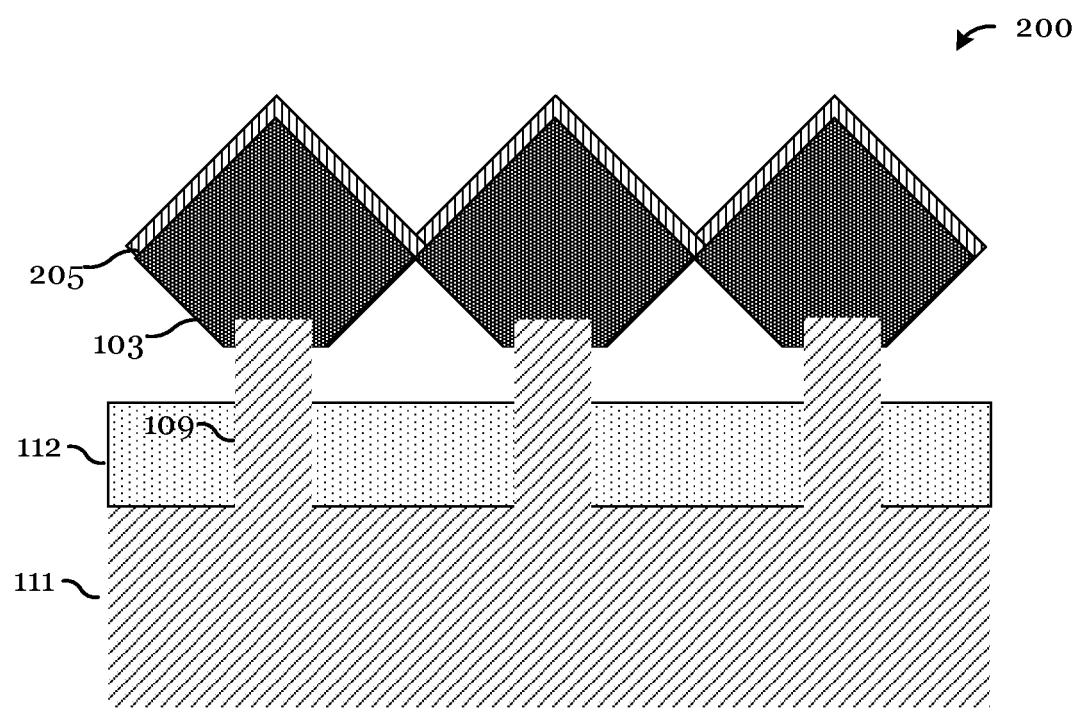

FIGS. 15A-15B illustrate a cross sectional view of the semiconductor device 200, during a subsequent stage of fabrication, after removing the organic fill material, in accordance with an embodiment of the present invention. FIG. 15A illustrates a cutline similar to FIG. 3A while FIG. 15B illustrates a cutline similar to FIG. 3B.

As illustrated in FIGS. 15A-15B, the remaining portion of the organic fill 114 is removed from the bottom of the trench between the plurality of spacers 101. After removing the remaining portion of the organic fill 114, a small portion of the etch stop layer 204 is left behind forming a modified local etch stop layer 205. This modified local etch stop layer 205 behaves similar to the LESL 104 discussed in the prior embodiment, which was formed in a single step.

Accordingly, similar processing as described in FIGS. 5A-10B may follow. However, in some embodiments, a small portion of the modified local etch stop layer 205 may still remain in the final device if the subsequent removal of the modified local etch stop layer 205 involves an anisotropic process.

Figure 16:
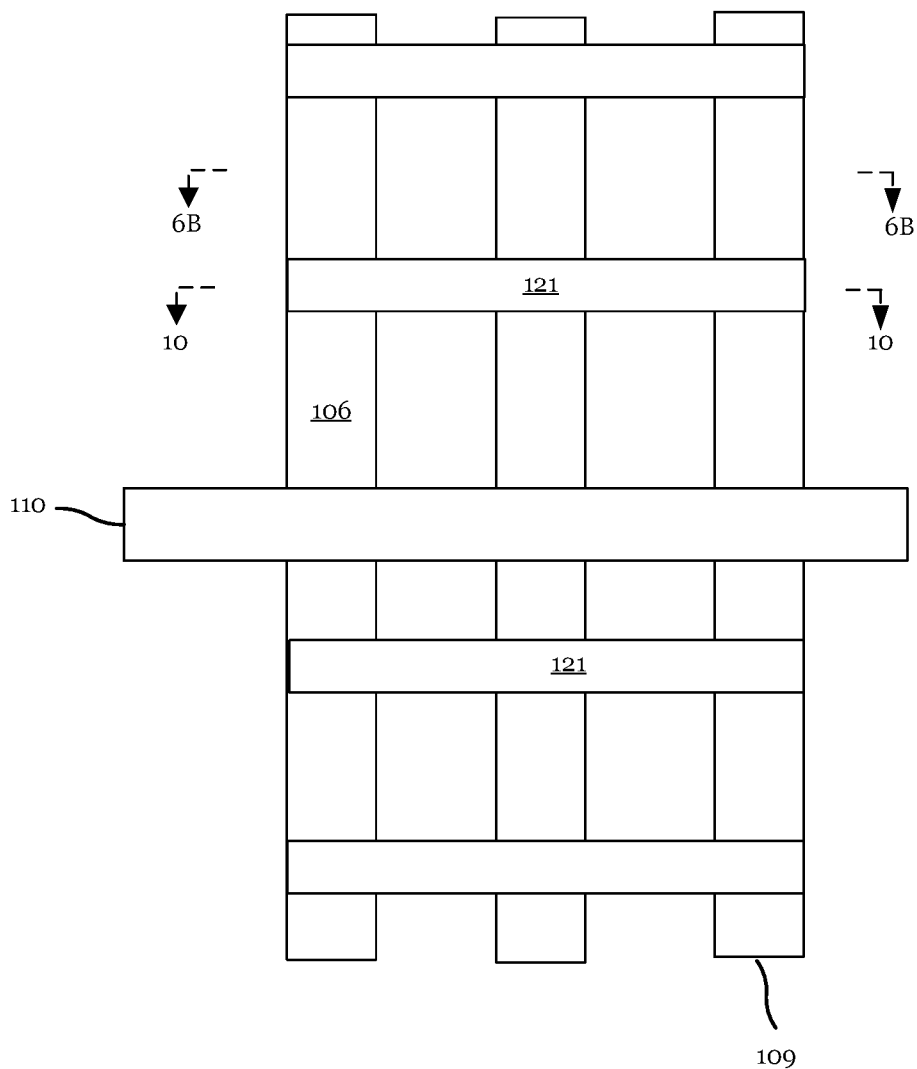
FIG. 16 illustrates a top view of the semiconductor device during a next stage of fabrication, after forming contact plugs, in accordance with an embodiment of the present invention.

FIG. 16 illustrates a top view of the semiconductor device during a next stage of fabrication, after forming contact plugs, in accordance with an embodiment of the present invention.

In some embodiments or in some structures, for examples, with less dense gates, some portion of the raised source/drain regions may be contacted. For example, as shown in the top view, openings for contact plugs 121 are formed at select places on the raised source/drain regions. Accordingly, a cross-sectional view along a cut line 10-10 is similar to as previously described in FIG. 10B. However, a cross-sectional view along the cut line 6B-6B is similar to as previously described in FIG. 6B. Accordingly, along the direction of the plurality of fins 109, a plurality of contacts (two on either side of the isolated gate 110 in this illustration) is made to the raised source/drain regions.

Advantages of various embodiments described herein may include semiconductor devices exhibiting less plasma damage, thus resulting in a decrease in the severity of surface roughening, surface oxidation, crystal structure relaxation, and elemental doping; all of which could lead to more controlled electrical performance.

Accordingly embodiments of this present invention provide a method to minimize damage to epitaxial regions.

Example embodiments of the invention are summarized here. Other embodiments can also be understood from the entirety of the specification as well as the claims filed herein.

Example 1. In an exemplary embodiment, as illustrated in FIG. 2, method comprises forming a metal based etch stop layer (e.g., protective layer 45 in FIG. 1A) covering a surface of a semiconductor substrate (box 21). The method may further comprise forming a nitride etch stop layer (e.g., etch stop layer 42 in FIG. 1A) over the metal based etch stop layer (box 22). The method may further comprise etching the nitride etch stop layer with a plasma etch process to expose a surface of the metal based etch stop layer (box 23) (see FIG. 1B). The method may further comprise removing the metal based etch stop layer using an etching process that selectively removes the metal based etch stop layer (box 24), e.g., using a gentler process (see FIG. 1B).

Example 2. The method of example 1, where the metal based etch stop layer includes aluminum oxide, titanium oxide, or titanium nitride, and where the nitride etch stop layer includes silicon nitride.

Example 3. The method of one of examples 1 or 2, where the surface of a semiconductor substrate includes a top surface of a raised source/drain disposed on a fin that is formed over the semiconductor substrate.

Example 4. The method of one of examples 1 to 3, where the metal based etch stop layer is formed to cover the top surface of the raised source/drain.

Example 5. The method of one of examples 1 to 4, where the metal based etch stop layer is selectively deposited on the top surface in a single process step.

Example 6. The method of one of examples 1 to 5, where the single process step is an atomic layer deposition process.

Example 7. The method of one of examples 1 to 6, where the metal based etch stop layer is formed using an etch back process.

Figure 17A:
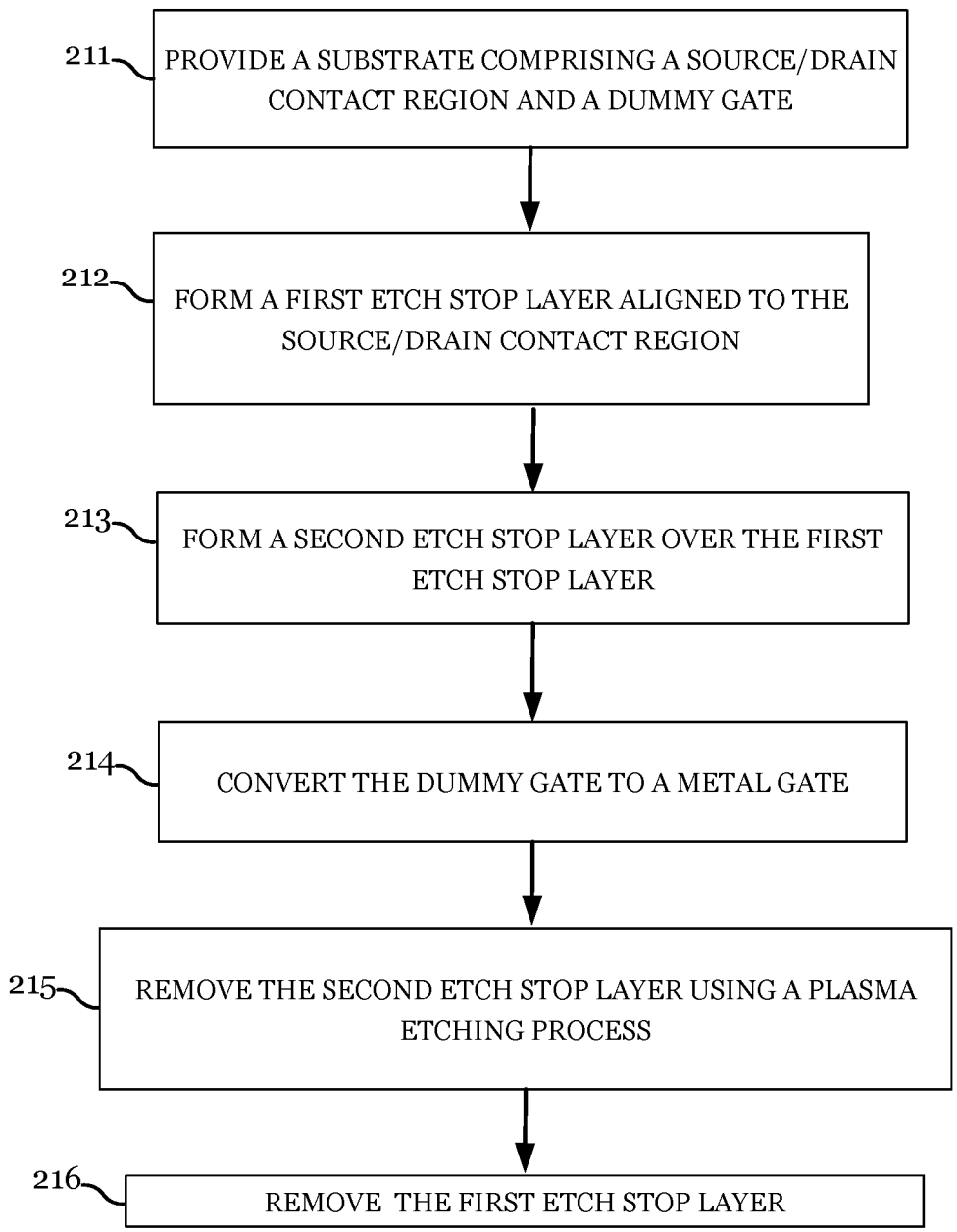
FIGS. 17A-17B illustrate a flow chart of exemplary methods of forming the semiconductor device.

Example 8. In another exemplary embodiment, as illustrated in FIG. 17A, a method includes providing a substrate comprising a source/drain contact region and a dummy gate (box 211), forming a first etch stop layer aligned to the source/drain contact region, where the first etch stop layer does not cover the dummy gate (box 212) (e.g., FIG. 4A, 15A). The method may include forming a second etch stop layer over the first etch stop layer, the second etch stop layer covering the first etch stop layer and the dummy gate (box 213) (e.g., FIG. 5A). The method may include converting the dummy gate to a metal gate (box 214) (e.g., FIG. 6A). The method may include removing the second etch stop layer using a plasma etching process (box 215) (e.g., FIG. 8A). The method may include removing the first etch stop layer (box 216) (e.g., FIG. 9A).

Example 9. The method of example 8, where forming the first etch stop layer includes selectively depositing the first etch stop layer only over the source/drain contact region without depositing over the dummy gate.

Example 10. The method of one of examples 8 or 9, where forming the first etch stop layer includes using an etch back process.

Example 11. The method of one of examples 8 to 10, where forming the first etch stop layer using an etch back process includes: depositing a conformal layer using an atomic layer deposition process; depositing an organic fill over the conformal layer; using an etch back process, removing portions of the organic fill to expose portions of the conformal layer; removing the exposed conformal layer; and removing the remaining portions of the organic fill.

Example 12. The method of one of examples 8 to 11, where the first etch stop layer includes a metal, and where the second etch layer includes silicon.

Example 13. The method of one of examples 8 to 12, where the first etch stop layer includes aluminum oxide, titanium oxide, aluminum nitride, or titanium nitride, and where the second etch layer includes silicon nitride.

Example 14. The method of one of examples 8 to 13, further including depositing a metal to physically contact the source/drain contact region.

Example 15. The method of one of examples 8 to 14, where removing the first etch stop layer includes using a wet etch chemistry.

Figure 17B:
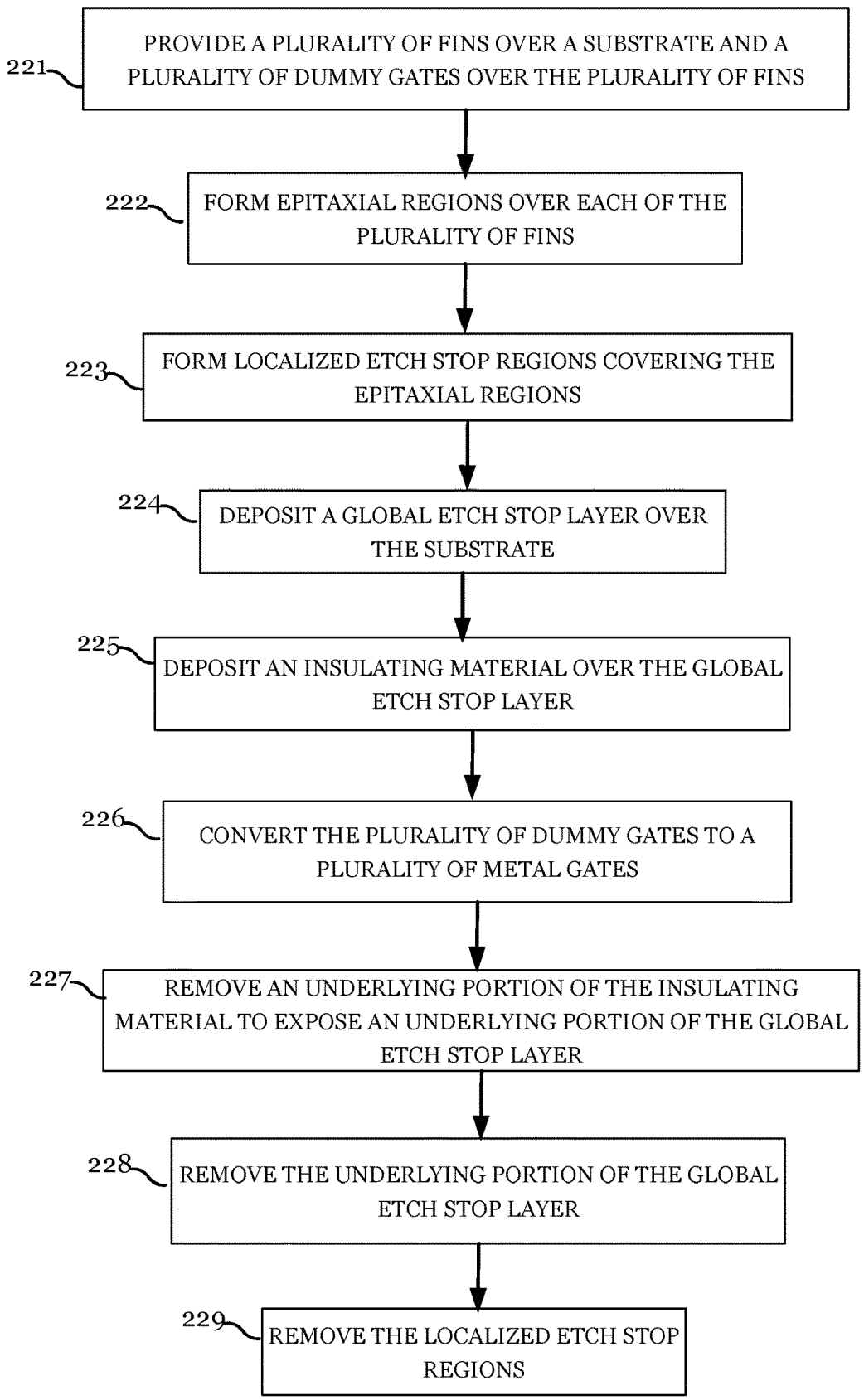

Example 16. In another exemplary embodiment, as illustrated in FIG. 17B, a method includes providing a plurality of fins over a substrate and a plurality of dummy gates over the plurality of fins (box 221), and forming epitaxial regions over each of the plurality of fins (box 222), where the epitaxial regions extending between adjacent ones of the plurality of dummy gates. The method includes forming localized etch stop regions covering the epitaxial regions, the localized etch stop regions being formed locally only over the epitaxial regions without covering the plurality of dummy gates (box 223) (e.g., FIG. 4A, 15A). The method may include depositing a global etch stop layer over the substrate, the global etch stop layer covering the plurality of dummy gates and the localized etch stop regions (box 224) (e.g., FIG. 5A). The method may include depositing an insulating material over the global etch stop layer (box 225) (e.g., FIG. 5A). The method may include converting the plurality of dummy gates to a plurality of metal gates (box 226) (e.g., FIG. 6A). The method may include using a contact opening mask, removing an underlying portion of the insulating material to expose an underlying portion of the global etch stop layer (box 227) (e.g., FIG. 7A). The method may include removing the underlying portion of the global etch stop layer by a plasma etch process (box 228) (e.g., FIG. 8A). The method may include removing the localized etch stop regions (box 229) (e.g., FIG. 9A).

Example 17. The method of example 16, where forming the localized etch stop regions includes selectively depositing the localized etch stop regions only over the epitaxial regions without covering the plurality of dummy gates.

Example 18. The method of one of examples 16 or 17, where forming the localized etch stop regions includes using an etch back process.

Example 19. The method of one of examples 16 to 18, where forming the localized etch stop regions using an etch back process includes depositing a conformal layer using an atomic layer deposition process; depositing an organic fill over the conformal layer; using an etch back process, removing portions of the organic fill to expose portions of the conformal layer; removing the exposed conformal layer; and removing the remaining portions of the organic fill.

Example 20. The method of one of examples 16 to 19, where the localized etch stop regions include a metal, and where the global etch stop layer includes silicon.

Example 21. The method of one of examples 16 to 20, where the localized etch stop regions include aluminum oxide, titanium oxide, aluminum nitride, or titanium nitride, and where the global etch stop layer includes silicon nitride.

Example 22. The method of one of examples 16 to 21, further including depositing a metal to physically contact with contact areas of the epitaxial regions.

Example 23. The method of one of examples 16 to 22, where removing the localized etch stop regions includes using a wet etch chemistry.

Example 24. A semiconductor device including: a fin disposed over a semiconductor substrate; an isolation region disposed proximate to the fin; a metal gate disposed over the fin; a raised source/drain region disposed over the fin, the top surface including a contact area and remaining area; a metal based etch stop layer disposed over the raised source/drain region, the metal based etch stop layer covering substantially all of the remaining area of the top surface of the raised source/drain region; and a nitride etch stop layer disposed over the metal based etch stop layer and the isolation region, the nitride etch stop layer contacting the isolation region and separated from the remaining area of the top surface by the metal based etch stop layer.

Example 25. The device of example 24, where the nitride etch stop layer is disposed along sidewalls of the metal gate.

Example 26. The device of one of examples 24 or 25, where the metal based etch stop layer includes aluminum oxide, titanium oxide, aluminum nitride, or titanium nitride, and where the nitride etch stop layer includes silicon nitride.

Example 27. The device of one of examples 24 to 26, further including a contact plug contacting the contact area of the raised source/drain region.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
providing a substrate comprising a source/drain contact region and a dummy gate;
forming a first etch stop layer conformally over the source/drain contact region, the first etch stop layer not covering the dummy gate;
forming a second etch stop layer conformally over the substrate, the second etch stop layer covering a spacer, the first etch stop layer and the dummy gate, the spacer positioned on a sidewall of the dummy gate;
exposing the dummy gate by removing a portion of the second etch stop layer;
replacing the dummy gate with a metal gate;
removing the second etch stop layer completely using a plasma etching process to expose the first etch stop layer and the spacer, the first etch stop layer preventing exposure of the source/drain contact region to the plasma etching process; and
after the removing the second etch stop layer completely, removing the first etch stop layer completely using a non-plasma etching process to uncover the source/drain contact region.

2. The method of claim 1, wherein forming the first etch stop layer comprises selectively depositing the first etch stop layer only over the source/drain contact region without depositing over the dummy gate.

3. The method of claim 1, wherein forming the first etch stop layer comprises using an etch back process.

4. The method of claim 3, wherein forming the first etch stop layer using an etch back process comprises:
depositing a conformal layer using an atomic layer deposition process;
depositing an organic fill over the conformal layer;
using an etch back process, removing portions of the organic fill to expose portions of the conformal layer;
removing the exposed conformal layer; and
removing the remaining portions of the organic fill.

5. The method of claim 1, wherein the first etch stop layer comprises a metal, and wherein the second etch layer comprises silicon.

6. The method of claim 1, wherein the first etch stop layer comprises aluminum oxide, titanium oxide, aluminum nitride, or titanium nitride, and wherein the second etch layer comprises silicon nitride.

7. The method of claim 1, further comprising depositing a metal to physically contact the source/drain contact region.

8. The method of claim 1, wherein removing the first etch stop layer comprises using a wet etch chemistry.

9. A method comprising:
providing a plurality of fins over a substrate and a plurality of dummy gates over the plurality of fins;
forming epitaxial regions over each of the plurality of fins, the epitaxial regions extending between adjacent ones of the plurality of dummy gates;
forming localized etch stop regions conformally covering the epitaxial regions, the localized etch stop regions being formed locally only over the epitaxial regions without covering the plurality of dummy gates;
depositing a global etch stop layer conformally over the substrate, the global etch stop layer covering spacers, the plurality of dummy gates and the localized etch stop regions, the spacers positioned on sidewalls of the plurality of dummy gates;
depositing an insulating material over the global etch stop layer;
exposing the plurality of dummy gates by removing portions of the global etch stop layer and portions of the insulating material;
replacing the plurality of dummy gates with a plurality of metal gates;
using a contact opening mask, removing an underlying portion of the insulating material to expose the global etch stop layer;
removing the global etch stop layer completely by a plasma etch process to expose the localized etch stop regions and the spacers; and
removing the localized etch stop regions completely, after the removing the global etch stop layer completely, to uncover the epitaxial regions.

10. The method of claim 9, wherein forming the localized etch stop regions comprises selectively depositing the localized etch stop regions only over the epitaxial regions without covering the plurality of dummy gates.

11. The method of claim 9, wherein forming the localized etch stop regions comprises using an etch back process.

12. The method of claim 11, wherein forming the localized etch stop regions using an etch back process comprises:
   depositing a conformal layer using an atomic layer deposition process;
   depositing an organic fill over the conformal layer;
   using an etch back process, removing portions of the organic fill to expose portions of the conformal layer;
   removing the exposed conformal layer; and
   removing the remaining portions of the organic fill.

13. The method of claim 9, wherein the localized etch stop regions comprise a metal, and wherein the global etch stop layer comprises silicon.

14. The method of claim 9, wherein the localized etch stop regions comprise aluminum oxide, titanium oxide, aluminum nitride, or titanium nitride, and wherein the global etch stop layer comprises silicon nitride.

15. The method of claim 9, further comprising depositing a metal to physically contact with contact areas of the epitaxial regions.

16. The method of claim 9, wherein removing the localized etch stop regions comprises using a wet etch chemistry.

* * * * *